US010089073B2

(12) United States Patent
Ho et al.

(10) Patent No.: US 10,089,073 B2
(45) Date of Patent: Oct. 2, 2018

(54) METHOD AND APPARATUS FOR CONVERTING FROM INTEGER TO FLOATING POINT REPRESENTATION

(71) Applicants: Huong Ho, Woodlawn (CA); Michel Kafrouni, Ottawa (CA)

(72) Inventors: Huong Ho, Woodlawn (CA); Michel Kafrouni, Ottawa (CA)

(73) Assignee: Huawei Technologies Co., Ltd., Shenzhen (CN)

( * ) Notice: Subject to any disclaimer, the term of this patent is extended or adjusted under 35 U.S.C. 154(b) by 554 days.

(21) Appl. No.: 14/610,029

(22) Filed: Jan. 30, 2015

(65) Prior Publication Data
US 2016/0224318 A1    Aug. 4, 2016

(51) Int. Cl.
*G06F 5/01*        (2006.01)
*H03M 7/28*        (2006.01)
*H03M 7/24*        (2006.01)

(52) U.S. Cl.
CPC ............. *G06F 5/012* (2013.01); *H03M 7/24* (2013.01); *H03M 7/28* (2013.01)

(58) Field of Classification Search
CPC ............ H03M 7/04; H03M 7/24; G06F 5/012
USPC ....................... 708/204, 209, 525; 341/50, 95
See application file for complete search history.

(56) References Cited

U.S. PATENT DOCUMENTS 5,257,215 A    10/1993  Poon et al.
5,394,351 A *  2/1995  Widigen ................. G06F 7/026
                                           340/146.2
5,701,504 A *  12/1997  Timko ..................... G06F 7/508
                                                  708/710
6,523,050 B1 *  2/2003  Dhablania ............... H03M 5/00
                                                  708/204
7,949,696 B2 *  5/2011  Ishii ........................ G06F 7/483
                                                  708/204

(Continued)

FOREIGN PATENT DOCUMENTS

CN       101355701      1/2009
CN       102122240      7/2011

OTHER PUBLICATIONS

R. Ananda Natarajan, Digital Design, PHI Learning Private Limited, Jan. 17, 2015, p. 174.*

(Continued)

*Primary Examiner* — Aimee Li
*Assistant Examiner* — Emily E Larocque

(57) ABSTRACT

Apparatus and methods for conversion from signed integer to a floating point representation are provided. Two's complementation and lead zero count operations are performed in parallel. Exponent generation and mantissa shifting are performed in parallel. Generation of the floating point exponent from the signed integer, including application of a scaling factor, is performed using a 3:2 compressor or carry-save adder and an adder. Two's complementation for generation of the mantissa in unsigned integer format is performed using an adder. Lead zero count for controlling mantissa shifting is performed by one's complementing the signed integer if negative, counting lead zeros in the one's complement output, and determining, using the one's complement output, whether the one's complement lead zero count differs from the two's complement lead zero count by one.

21 Claims, 15 Drawing Sheets

(56) References Cited

U.S. PATENT DOCUMENTS

| | | | |
|---|---|---|---|
| 8,880,571 B2* | 11/2014 | Srinivasan | H03M 7/24 708/200 |
| 2002/0165887 A1* | 11/2002 | Rogenmoser | G06F 7/74 708/211 |
| 2006/0047734 A1 | 3/2006 | Blainey et al. | |
| 2006/0101244 A1* | 5/2006 | Siu | G06F 7/483 712/221 |
| 2014/0188963 A1* | 7/2014 | Tsen | G06F 7/483 708/209 |

OTHER PUBLICATIONS

Huawei Technologies Co., Ltd., International Patent Application No. PCT/CN2015/098802, filed on Dec. 24, 2015, International Search Report and Written Opinion dated Mar. 24, 2016.
English Abstract of Chinese Patent Application No. CN101355701.
English Abstract of Chinese Patent Application No. CN102122240.

* cited by examiner

US 10,089,073 B2

METHOD AND APPARATUS FOR CONVERTING FROM INTEGER TO FLOATING POINT REPRESENTATION

CROSS-REFERENCE TO RELATED APPLICATIONS

This is the first application filed for the present invention.

FIELD OF THE INVENTION

The present invention pertains to the field of digital circuits and in particular to a method and apparatus for converting a number from its signed integer representation to its floating point representation.

BACKGROUND

Numbers can be digitally represented using a variety of binary representations, often referred to as number formats. Integer number formats include signed integers, which generally use a two's complement format for representing positive and negative numbers, and unsigned integers, which are restricted to positive values. Floating point or "real" number formats include 16-bit half precision, 32-bit single precision and 64-bit double precision formats, such as those specified in the IEEE 754 series of standards. These formats can include a sign field, an exponent field, and a mantissa or "significand" field for representing a wide range of values.

It is often required to convert a number from one format to another, in order to represent the number in an appropriate format for a particular processing task. Such conversion operations may be required in applications, for example Digital Signal Processing circuits, such as those used in wireless communication applications, as well as other general-purpose or special-purpose computing applications and integrated circuitry. Various applicable conversion circuits such as combinatorial logic circuits are known. However, prior art conversion circuits tend to exhibit performance limitations for example in terms of gate delay, logic depth, power consumption, circuit throughput, number of transistors required for implementation, and the like. In order to improve overall application performance, the performance of number format conversion circuits may require improvement.

Therefore there is a need for a method and apparatus for converting a number from its signed integer representation to its floating point representation, that is not subject to one or more limitations of the prior art.

This background information is provided to reveal information believed by the applicant to be of possible relevance to the present invention. No admission is necessarily intended, nor should be construed, that any of the preceding information constitutes prior art against the present invention.

SUMMARY

An object of embodiments of the present invention is to provide a method and apparatus for converting a number from a signed integer representation to a floating point representation. In accordance with embodiments of the present invention, there is provided an apparatus for facilitating conversion of a signed integer representation to a floating point representation. The signed integer representation has a two's complement format. The apparatus includes a two's complement module, which may also be referred to as two's complement circuitry, and a lead zero count module, which may also be referred to as lead zero count circuitry, operating in parallel with the two's complement module. The two's complement module is configured to generate an intermediate output corresponding to an absolute value of the signed integer representation, the absolute value expressed in two's complement format. The lead zero count module is configured to make a determination of a number of leading zeros that are expected to occur in the intermediate output, said determination made independently from generation of the intermediate output. The exponent generation module, which may also be referred to as exponent generation circuitry, is operatively connected to the lead zero count module to receive the determined number of leading zeros and is configured to generate an exponent value for the floating point representation in accordance with the received number of leading zeros determined. The shift execution module, which may also be referred to as shift execution circuitry, is configured to left shift the intermediate output by a number of bit positions determined in accordance with the determined number of leading zeros, wherein the shift execution module outputs a mantissa of the floating point representation under a predefined condition.

In accordance with embodiments of the present invention, there is provided an apparatus for counting a number of leading zeros expected to occur in an absolute value of a signed integer representation. The absolute value is expressed in two's complement format. The apparatus includes a one's complement sub-module, which may also be referred to as one's complement sub-circuitry, a one's complement lead zero count sub-module, which may also be referred to as one's complement lead zero count sub-circuitry, and a lead zero error detection sub-module, which may also be referred to as lead zero error detection sub-circuitry, operating in parallel with the one's complement lead zero count sub-module. The one's complement sub-module is configured to generate a first output corresponding to a one's complement of the signed integer representation if the signed integer representation is negative and corresponding to the signed integer representation if the signed integer representation is positive. The one's complement lead zero count sub-module is configured to determine a number of leading zeros present in the first output. The lead zero error detection sub-module is configured to determine if the number of leading zeros present in the first output differs from a number of leading zeros of the absolute value output. The lead zero error detection module omits explicit use or computation of the absolute value output. The lead zero error detection module is further configured to set a zero count error flag if the number of leading zeros present in the first output differs from the number of leading zeros of the absolute value output.

In accordance with embodiments of the present invention, there is provided an apparatus for subtracting a first N-bit value A and a second N-bit value B from a maximum value D and adding a third value C thereto. The maximum value D is a fixed value which corresponds to a largest quantity expressible in N bits. The apparatus includes a 3:2 compressor, an adder and an inverter. The 3:2 compressor is configured to receive a first input corresponding to a bit-wise inversion of first N-bit value A and a second input corresponding to a bit-wise inversion the second N-bit value B. The 3:2 compressor is further configured to generate a sum output and a carry output corresponding to carry-save addition of the first input with the second input and with a constant value of one. The adder is configured to receive and add the sum output, the carry output, and the third value C.

The third value C is a one-bit value which is provided to an external carry-in input of the adder. The inverter is configured to invert a most significant bit of the adder output. This facilitates subtraction of the first N-bit value A and a second N-bit value B from the maximum value D.

In accordance with embodiments of the present invention, there is provided a method for facilitating conversion of a signed integer representation to a floating point representation. The signed integer representation has a two's complement format. The method includes a two's complement operation and a lead zero count operation operating concurrently with the two's complement operation. The two's complement operation generates an intermediate output corresponding to an absolute value of the signed integer representation, the absolute value expressed in two's complement format. The lead zero count operation makes a determination of a number of leading zeros that are expected to occur in the intermediate output. The determination is made independently from said generation of the intermediate output. The exponent generation operation generates an exponent value for the floating point representation in accordance with the number of leading zeros determined. The shift execution operation left shifts the intermediate output by a number of bit positions determined in accordance with the determined number of leading zeros, wherein the shift execution operation outputs a mantissa of the floating point representation under a predefined condition.

In accordance with embodiments of the present invention, there is provided a method for counting a number of leading zeros expected to occur in an absolute value of a signed integer representation. The absolute value is expressed in two's complement format. The method includes a one's complement sub-operation, a one's complement lead zero count sub-operation and a lead zero error detection sub-operation operating concurrently with the one's complement lead zero count sub-operation. The one's complement sub-operation generates a first output corresponding to a one's complement of the signed integer representation if the signed integer representation is negative and corresponding to the signed integer representation if the signed integer representation is positive. The one's complement lead zero count sub-operation determines a number of leading zeros present in the first output. The lead zero error detection sub-operation determines if the number of leading zeros present in the first output differs from a number of leading zeros of the absolute value output. The lead zero error detection sub-operation omits explicit use or computation of the absolute value output. The lead zero error detection sub-operation sets a zero count error flag if the number of leading zeros present in the first output differs from the number of leading zeros of the absolute value output.

In accordance with embodiments of the present invention, there is provided a method for subtracting a first N-bit value A and a second N-bit value B from a maximum value D and adding a third value C thereto. The maximum value D is a fixed value corresponding to a largest quantity expressible in N bits. The method includes receiving a first input corresponding to a bit-wise inversion of first N-bit value A and receiving a second input corresponding to a bit-wise inversion the second N-bit value B. The method further includes generating a sum output and a carry output corresponding to carry-save addition of the first input with the second input and with a constant value of one. The method further includes receiving and add the sum output, the carry output, and the third value C, the third value C is a one-bit value which is treated as an external carry-in addition input. The method further includes inverting a most significant bit of the adder output. This facilitates subtraction of the first N-bit value A and a second N-bit value B from the maximum value D.

In accordance with embodiments of the present invention, there is provided a computer program product comprising a memory having recorded thereon statements and instructions for execution by a processor to carry out a method as defined above. The method may be the above-described method for conversion of a signed integer representation to a floating point representation, the signed integer representation having a two's complement format. The method may be the above-described method for counting a number of leading zeros expected to occur in an absolute value of a signed integer representation. The method may be the above-described method for subtracting a first N-bit value A and a second N-bit value B from a maximum value D and adding a third one-bit value C thereto.

BRIEF DESCRIPTION OF THE FIGURES

Further features and advantages of the present invention will become apparent from the following detailed description, taken in combination with the appended drawings, in which.

It will be noted that throughout the appended drawings, like features are identified by like reference numerals.

DETAILED DESCRIPTION

Definitions

Figure 1:
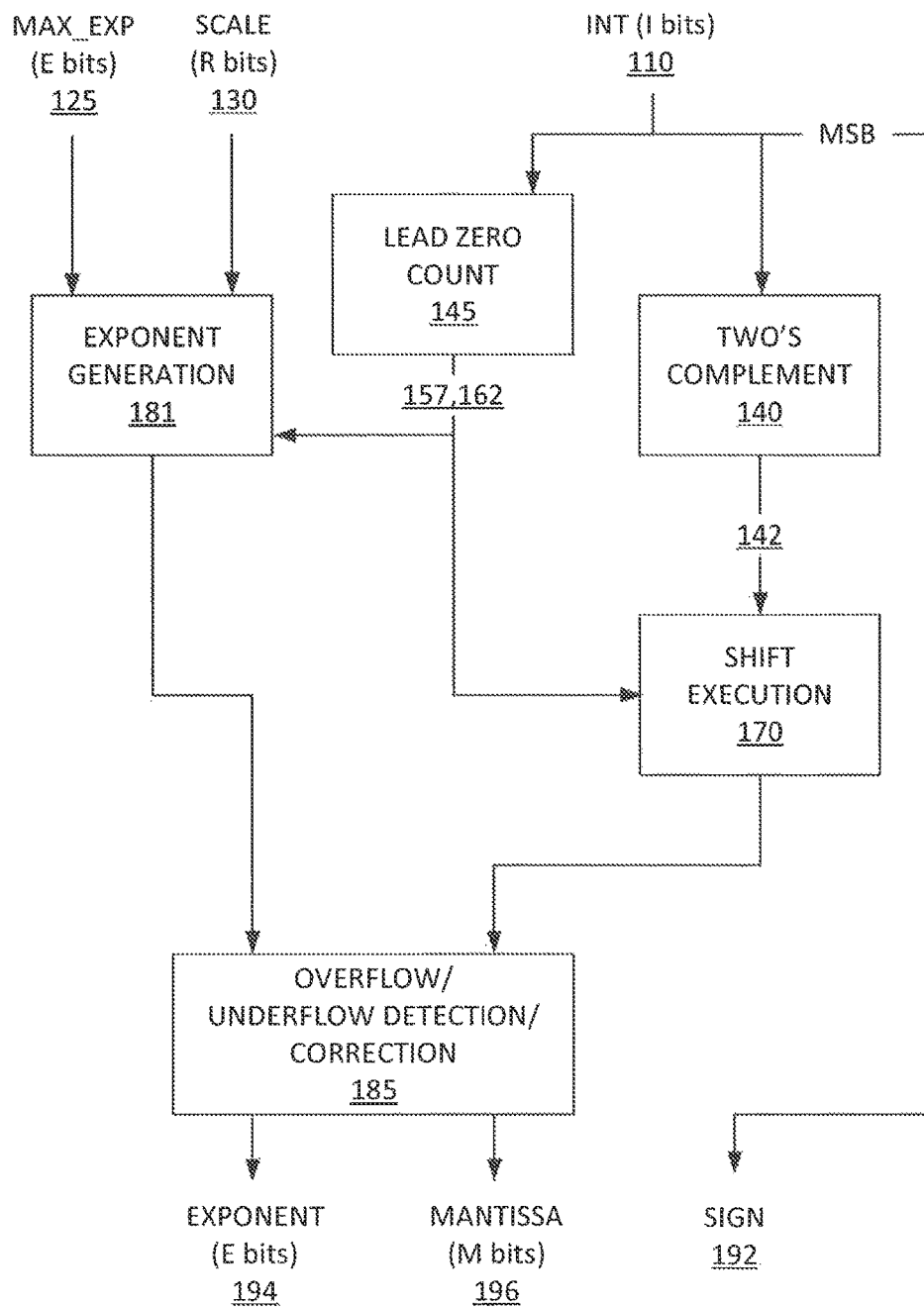
FIG. 1 illustrates method and apparatus for converting a signed integer representation to a floating point representation in accordance with some embodiments of the present invention.

As used herein, the term "about" should be read as including variation from the nominal value, for example, a +/−10% variation from the nominal value. It is to be understood that such a variation is always included in a given value provided herein, whether or not it is specifically referred to.

Unless defined otherwise, all technical and scientific terms used herein have the same meaning as commonly understood by one of ordinary skill in the art to which this invention belongs.

Although various aspects of the present invention are described primarily herein with respect to digital circuitry and modules thereof, it will be readily appreciated that the operation of such digital circuitry and modules may correspond to aspects of a method, such as a computer-implemented method, for performing operations such as integer to floating point conversion, or for performing sub-operations that may be used either in support of such conversion or for other purposes. Conversely, operations which are described in terms of operations or processes may be implemented via digital circuitry and/or modules comprising digital circuitry. Appropriate digital circuitry may include logic gates, collections of logic gates derived from standard libraries, and the like, implemented in an appropriate silicon or integrated circuit medium such as but not limited to integrated circuits created by Very Large Scale Integration (VLSI) processes.

Further, although embodiments of the present invention are described in the context of integer to floating point conversion, various embodiments may assist in performing or facilitate such a conversion without necessarily performing the conversion in its entirety. For example, some embodiments may operate in conjunction with other circuitry or methods which initiate and/or complete the conversion. Furthermore, some embodiments of the present invention may be applied for processing purposes other than integer to floating point conversion. For example, modules or component operations such as the two's complement module, lead zero count module, and exponent generation module, or portions thereof, may be generally applicable in other areas, for example where two's complementation is desired, or where lead zero counting for a hypothetical two's complement representation is desired. Further, certain embodiments of the exponent generation module as described herein facilitate an efficient addition of several numbers of a particular form, which may be applicable in other circumstances.

Circuit and Method Overview

Aspects of the present invention provide a method and apparatus for converting a signed integer representation to a floating point representation. Further, in various embodiments, scaling may be performed integrally with the conversion. Having reference to FIG. 1, which illustrates the conversion process in accordance with various embodiments of the present invention, the signed integer representation 110 is a two's complement representation, whereas the floating point representation generally includes a sign 192, an exponent 194, and a mantissa 196. In various embodiments, one or more additional inputs potentially influencing the conversion process may also be provided, such as a maximum exponent value 125 and a scaling factor 130. These additional inputs may be fixed inputs, for example hard-wired or otherwise incorporated into the conversion circuitry, or variable inputs provided for example by additional input busses.

Continuing with reference to FIG. 1, the conversion process comprises performing a two's complement operation 140 concurrently and/or in parallel with a lead zero count operation 145. The two's complement operation 140 comprises converting the signed integer representation 110 to an unsigned integer representation 142, for example by computing the absolute value of the number represented in the signed integer representation. The lead zero count operation 145 may include several sub-operations to be described below, and comprises determining a number of leading zeros that are anticipated to occur in the unsigned integer representation of the signed integer input, without necessarily explicitly computing the unsigned integer representation in its entirety within the lead zero count operation. The conversion process further comprises performing a shift execution operation 170 in which the output of the two's complement operation 140 is shifted by a number of bit positions determined in accordance with the number of lead zeros determined by the lead zero count operation 145. The shift execution operation 170 may include two sub-operations as described in more detail below.

Various embodiments of the present invention further comprise an exponent generation operation 181, which is configured to determine a value for the output exponent 194 in accordance with output of the lead zero count operation 145. For example, in various embodiments, if k leading zeros are counted, the shift execution operation 170 may perform a left shift of k bit positions, and the exponent generation operation 181 may correspondingly decrement the exponent value to be output by k. The output of the lead zero count operation 145 may include plural outputs which may be applied at plural stages of the exponent generation operation 181. The exponent generation operation may further be configured to determine the value for the output exponent 194 based in part on one or both of the maximum exponent value 125 and the scaling factor 130. The maximum exponent value 125 may be defined by the format of the floating point representation, and may be used as a reference basis for calculation of the appropriate exponent, for example by subtracting the number of leading zeros and the scaling factor from same. The maximum exponent value 125 may be represented in unsigned integer format and may be a constant when the floating point format is fixed. The scaling factor 130 may be used to re-scale the output floating point representation, for example by subtracting the scaling factor from the exponent to be output. In some embodiments, the scaling factor 130 is provided as a signed integer in two's complement format. Re-scaling may be appropriate in a variety of situations, as would be readily understood by a worker skilled in the art. In various embodiments, the exponent generation operation may be performed at least in part concurrently and/or in parallel with the shift execution operation.

In some embodiments, the outputs of the shift execution operation 170 and/or the exponent generation module 181 may be passed as the output mantissa 196 and exponent 194 of the floating point representation, respectively, for a predetermined condition, for example where there is not an overflow condition or an underflow condition.

However, in some embodiments there may be is a potential for error due to an overflow condition or an underflow condition. Overflow may occur for example as a result of the exponent generation operation and/or the shift execution operation. Overflow or underflow in the exponent may occur for example when the output of the exponent generation module falls outside of a pre-defined range expressible by the floating point representation. For example, a negative output of the exponent generation operation may indicate an underflow. As another example, when the floating point representation allocates 8 bits to the exponent, such as in an IEEE 754 single precision floating point representation, then an output of the exponent generation module of greater than 255 may indicate an overflow. Additionally, if the result of the shift execution operation is zero but the input signed integer representation is non-zero, then an underflow may be deemed to have occurred. Various embodiments of the present invention may therefore also perform an overflow/underflow detection operation, which corresponds to operation 185 in the embodiment of FIG. 1, for example via operation of a corresponding overflow/underflow detection module, which may also be referred to as overflow/underflow detection circuitry. This detection operation may be performed on the outputs of the exponent generation operation 181 and/or the shift execution operation 170, to provide the output exponent 194 and mantissa 196 of the floating point representation.

In some embodiments, when an overflow condition or an underflow condition is detected, it is also corrected. The correction generally causes the overall output of the conversion process to saturate on overflow or underflow. Such saturation is often preferred in digital signal processing applications since it simulates what happens to analog signals when overflow and underflow occur. Further, saturation avoids the need to test status registers and branch on overflow conditions, operations which may be incompatible with efficiently pipelined processes. In some embodiments, overflow correction comprises setting the exponent 194 to a pre-defined high limit or low limit value if the exponent would otherwise fall above or below the range defined by pre-defined high limit or low limit value, respectively.

It is further noted that the sign 192 of the floating point representation may, in various embodiments, be derived directly from the signed integer representation 110. For example if the signed integer representation is in two's complement format, then the sign bit 192 may correspond to the most significant bit of the signed integer representation 110. This sign bit may also be used internally, for example as a SELECT input to a multiplexer of a one's complement sub-operation of the lead zero count operation 145, as described below.

Figure 2:
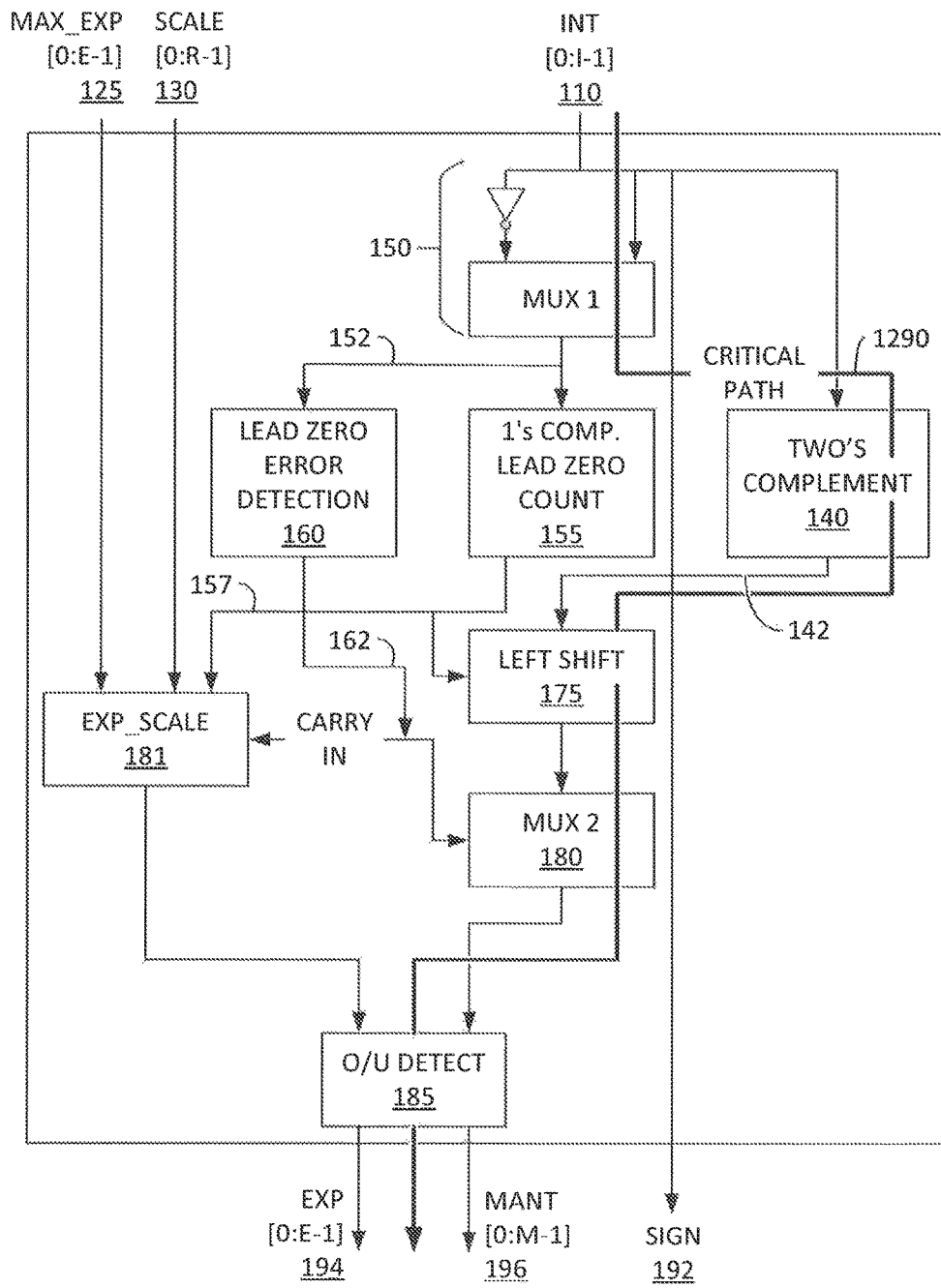
FIG. 2 also illustrates method and apparatus for converting a signed integer representation to a floating point representation in accordance with some embodiments of the present invention.

With reference to FIG. 2, which illustrates some embodiments of the present invention and has plural similar components to FIG. 1, the sub-operations of the lead zero count operation 145 may include a one's complement sub-operation 150, a one's complement lead zero count sub-operation 155, and a lead zero error detection sub-operation 160. The one's complement sub-operation 150 is configured to generate an output 152 which corresponds to the signed integer representation 110 if the signed integer representation is positive, and which corresponds to a one's complement (for example derived by bit-wise inversion) of the signed integer representation 110 if the signed integer representation is negative. The one's complement lead zero count sub-operation 155 is configured to determine a number of leading zeros of the output of the one's complement operation, as a surrogate 157 for the number of leading zeros of the unsigned integer representation 142 output by the two's complement operation 140. The surrogate 157 may be viewed as an estimate of the true number of leading zeros of the unsigned integer representation 142. However, it is recognized that the number of leading zeros output by the one's complement operation may potentially differ by one from the number of leading zeros output by the two's complement operation. Therefore, the lead zero error detection sub-operation 160, which may operate concurrently and/or in parallel with at least the one's complement lead zero count operation 155, is performed. The output of the lead zero error detection sub-operation 160 may be an error flag 162 such as a correction factor and/or bit value which indicates whether the number of leading zeros output by the one's complement operation differs from the number of leading zeros output by the two's complement operation. For example, the error flag 162 may be set if the number of leading zeros of the two operations differs and the error flag 162 may be clear otherwise. In positive logic, a set flag takes a binary value of "1" and a clear flag takes a binary value of "0." Thus, taken together, the surrogate or estimate 157 and the error flag 162 may be used to indicate the number of leading zeros occurring in the output 142 of the two's complement operation 140, without explicitly computing said output within the lead zero count operation 145. This facilitates parallelization of the lead zero count operation 145 with the two's complement operation 140.

In some embodiments, the sub-operations of the shift execution operation 170 may include a first shift operation 175 and a second shift and/or multiplexer operation 180 operating in series. The first shift operation 175 is configured to shift the output 142 of the two's complement operation 140 by a number of bit positions determined in accordance with the surrogate or estimate 157 value output by the lead zero count operation 145, for example as output by the one's complement lead zero count sub-operation 155. The second shift and/or multiplexer operation 180 is configured to further shift the output of the first shift operation by one additional bit position if the error flag 162 indicates that the number of leading zeros output by the one's complement operation differs from (for example overestimates by one) the number of leading zeros output by the two's complement operation. In various embodiments, the first shift operation 175 is a left shift operation, whereas the second shift and/or multiplexer operation 180 is a right shift operation which executes a shift of one bit position when the error flag 162 is set. When right shifting, the most significant bit of output of the second shift and/or multiplexer operation 180 may be set to binary '1'. In various embodiments, shifts performed by the shift execution operation may be left-shifts, right-shifts, or a combination thereof, as appropriate. In a left-shift, the most significant bit of the input is dropped and replaced by the next most significant bit, and the least significant bit is replaced by a predetermined value, such as a "0" value. In a right-shift, the least significant bit of the input is dropped and replaced by the next least significant bit, and the most significant bit is replaced by a predetermined value, such as a "0" value. However, other shifts such as cyclic shifts may be implemented if appropriate. In a cyclic left-shift, rather than dropping the most significant bit, the least significant bit is replaced by the most significant bit. In a cyclic right-shift, rather than dropping the least significant bit, the most significant bit is replaced by the least significant bit. In one embodiment, the first shift operation 175 is a left-shift operation or cyclic left-shift operation, while the second shift/multiplexer operation 180 is a right shift operation or possibly a cyclic right-shift operation.

The various operations and sub-operations set forth above may, respectively, correspond to and/or be executed by corresponding modules and sub-modules, each of which may be implemented using digital logic circuitry and may also be represented in FIGS. 1 and 2 by the corresponding reference numerals. For example, the apparatus may comprise a two's complement module 140, a lead zero count module 145 including a one's complement sub-module 150, a one's complement lead zero count module 155, a lead zero error detection sub-module 160, a shift execution module 170, an exponent generation module 181, and an overflow/underflow detection and/or correction module 185.

It is noted that the parallelization of various operations and/or modules, for example concurrent execution thereof, may provide improved performance relative to certain other implementations which perform comparable operations serially. Parallelization and/or concurrent execution may be partial, for example with one operation taking a shorter amount of time than another, in which case beginning of the shorter duration operation may optionally be delayed.

In some embodiments, the lead zero count operation may be performed in parallel with the two's complement operation and/or module. The parallel operation may be partial or full. For example, partial parallel operation of a first operation with a second operation may arise when a sub-operation of the first operation is executed in parallel with a sub-operation of the second operation, but further sub-operations of the first and second operations may be executed in a non-parallel manner. Optionally, the two's complement operation may be operated in parallel with the one's complement lead zero count sub-operation and/or the lead zero detection sub-operation, but may be in series with the one's complement sub-operation. For example, the two's complement operation may operate, with appropriate modification, on the output of the one's complement sub-operation rather than on the unsigned integer input 110. Further, in some embodiments, the one's complement lead zero count sub-operation and/or module may be performed in parallel with the lead zero detection sub-operation and/or module. Yet further, the exponent generation operation may be performed in parallel with the shift execution operation.

As will become apparent from the description herein, embodiments of the present invention exhibit regular architecture, for example in that hierarchical decomposition of the overall system results in relatively simple and similar building blocks to a significant degree. As such, various embodiments of the present invention may be suitable for low area, low power circuit implementations such as VLSI implementations, and may be useful for accelerating computing power of various systems.

In more detail, the output floating point representation may be in IEEE 754 standard half-precision, single-precision or double-precision format. Such formats include an M-bit mantissa formatted as an unsigned integer, a sign bit denoting the sign of the number, and an E-bit exponent. As will be readily understood by a worker skilled in the art, a hidden bit is also typically implied in such formats, namely a leading "1" which is understood as being appended to the mantissa. The input I-bit signed integer representation may correspond to a two's complement binary representation of a number, such as a binary number in which positive quantities are represented by their corresponding binary value, and negative quantities k are represented by the binary value corresponding to the equation $2^n-|k|$, where n is the number of bits in the two's complement representation, as would be readily understood by a worker skilled in the art. In some embodiments, the floating point representation may correspond to a pseudo-floating point number such as a binary scaled number.

It is further noted that, for IEEE 754 standard formats, E is generally less than M. For example, E=5 and M=11 for half-precision, E=8 and M=24 for single-precision, and E=11 and M=53 for double-precision format.

In accordance with embodiments of the present invention, scaling corresponds to the application of a scaling factor, which is generally a power of 2. The scaling factor is such that the numeric value of the conversion process output corresponds to the numeric value of the conversion process input multiplied by the scaling factor. The number of bits in the scaling factor input is represented herein by the variable R. The R-bit exponent of the scaling factor may be represented in two's complement format. In various embodiments, scaling is integrated within the exponent generation operation and/or module, as described elsewhere herein.

Embodiments of the present invention may be applicable to digital circuit designs. In particular, an area of application of embodiments includes Digital Signal Processor (DSP) circuit designs for wireless communication applications. An advantage of some embodiments of the present invention corresponds to a relatively high throughput performance when compared with alternative designs. Another advantage of some embodiments is the relatively low logic resource usage, when compared with alternative designs, which may lead to correspondingly lower power consumption.

In various embodiments, the radix point in the I-bit fixed point (signed integer) data is assumed to be on the right side of the least significant bit (LSB).

Figure 3:
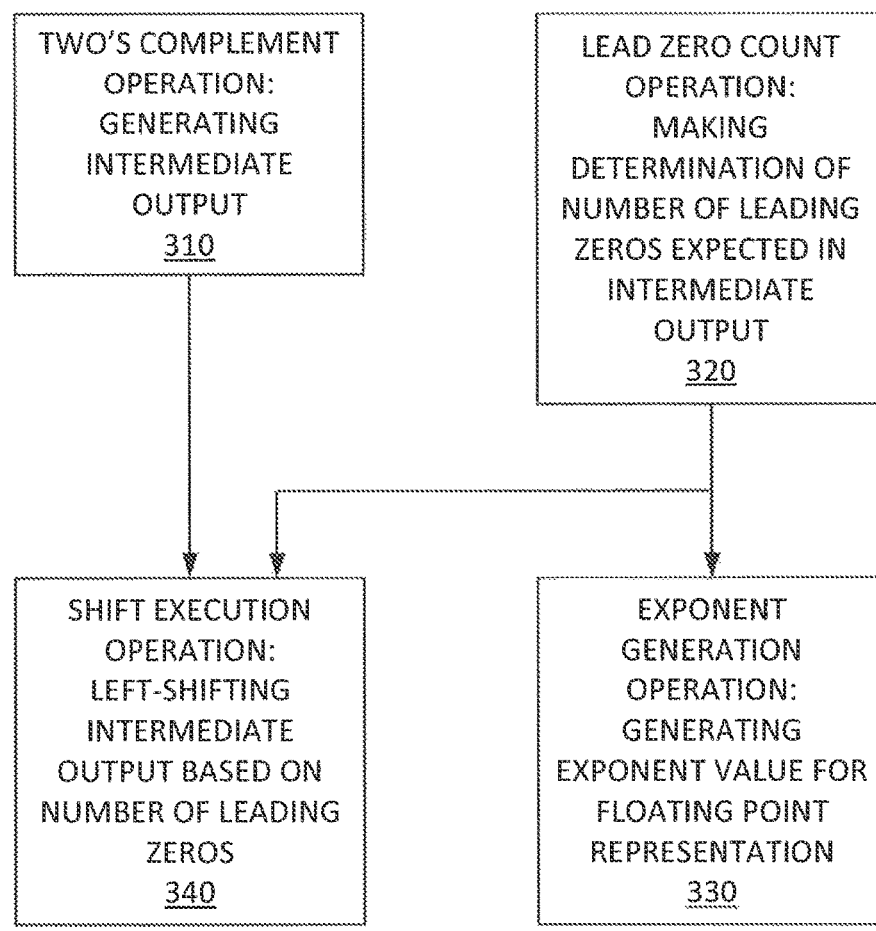
FIG. 3 illustrates a method for conversion of a signed integer representation to a floating point representation, in accordance with an embodiment of the present invention.

FIG. 3 illustrates a method for conversion of a signed integer representation to a floating point representation, in accordance with an embodiment of the present invention. The method includes a two's complement operation 310 comprising generating an intermediate output corresponding to an absolute value of the signed integer representation, the absolute value expressed in two's complement format. The method further includes a lead zero count operation 320 operating concurrently with the two's complement operation. The lead zero count operation comprises making a determination of a number of leading zeros that are expected to occur in the intermediate output, said determination made separately and/or independently from generation of the intermediate output. The method further includes an exponent generation operation 330 comprising generating an exponent value for the floating point representation in accordance with the number of leading zeros determined by the lead zero count module. The method further includes a shift execution operation 340 comprising left shifting the intermediate output by a number of bit positions determined in accordance with the number of leading zeros determined by the lead zero count module, wherein the shift execution operation outputs a mantissa of the floating point representation under a predefined condition.

Lead Zero Count Module

As mentioned above, the lead zero count module is configured to make a determination of the number of leading zeros occurring in an unsigned integer representation of the input signed integer representation (provided in two's complement format). For example, the number of leading zeros may equal zero if the most significant bit is "1," one if the two most significant bits are "01," two if the three most significant bits are "001," and so on. Furthermore, in various embodiments, the lead zero count module is configured to omit a full two's complement conversion for purposes of generating the count. Rather, the two's complement conversion may be performed substantially independently, for example in parallel, with the lead zero count, and correspondingly the determination of the number of leading zeros may be made substantially independently from generation of the intermediate output generated by the two's complement module. Such parallelization may reduce overall conversion delay, for example.

As also mentioned above, and in accordance with various embodiments of the present invention, the lead zero count module is configured to generate and operate on a pseudo-absolute value of the signed integer representation as generated by conditionally one's complementing the input signed integer representation if the signed integer representation is negative. As will be readily understood by a worker skilled in the art, performing a one's complement operation on binary data is generally a lower complexity operation than performing a two's complement operation, however the two operations are not completely equivalent. Thus, a lead zero count performed on output of the one's complement operation may not exactly match a lead zero count performed on output of a two's complement operation applied to the same input.

In particular, it is recognized herein that the lead zero count performed on output of the one's complement operation will either: (A) match the lead zero count performed on output of a two's complement operation applied to the same input; or (B) overestimate by one the lead zero count performed on output of a two's complement operation applied to the same input.

Therefore, some embodiments of the present invention are configured to derive the desired lead zero count via a pair of parallel operations. First, a one's complement lead zero count sub-module/sub-operation is provided for counting a number of leading zeros of the output of the one's complement operation, as a surrogate or estimate for the number of leading zeros of the unsigned integer representation that would have been output by the two's complement operation applied to the same data. Second, a lead zero error detection sub-module/sub-operation is provided to independently determine whether or not the one's complement lead zero count sub-module/sub-operation will have overestimated the number of lead zero by one, and to set an error flag bit to one if and only if such overestimation is deemed to occur. The lead zero error detection may therefore be used for providing a correction to the one's complement lead zero count.

One's Complement Sub-Module

In some embodiments, the one's complement sub-module comprises an inverter and a multiplexer, both of which may be I bits wide, for example as illustrated in FIG. 2 as components of the one's complement sub-module 150. The inverter is configured to perform bit-wise inversion on the input data, such as the signed integer representation. The output of the inverter and the input data are then provided as first and second alternatively selectable inputs to the multiplexer, respectively. The sign of the input data is used to select whether the first input or the second input to the multiplexer is selected as the multiplexer output. For example, if the sign of the input data is negative, then the first input is selected, otherwise if the sign is positive, then the second input is selected. For a signed integer representation in standard two's complement format, the most significant bit may be used directly as the sign of the input data ("0" if positive, "1" if negative). As mentioned above, the one's complement sub-module performs a pseudo-absolute value operation on the input data.

According to embodiments, the one's complement sub-module may correspond to a multiplexer ("MUX 1") which outputs a one's complement of the integer input if its value is negative. Alternatively, if the integer input is positive, the multiplexer outputs the integer input unchanged. Other or modified approaches for performing the required one's complement operation may also be used, as would be readily understood by a worker skilled in the art.

It is noted that the above one's complement sub-module comprises about two levels of two-input AND gate.

One's Complement Lead Zero Count Sub-Module

The lead zero count sub-module provided in accordance with various embodiments of the present invention may be one of a variety of standard implementations of a lead zero counter operating on the output of the one's complement sub-module. In various embodiments, in order to preserve efficiency, such as low latency of the overall circuit, it is desired to utilize a correspondingly efficient lead zero counter implementation for the one's complement lead zero count sub-module. For example, circuitry and/or methods as described in G. Dimitrakopoulos, K. Galanopoulos, C. Mavrokefalidis, and D. Nikolos, "Low Power Leading-Zero Counting and Anticipation Logic for High-Speed Floating Point Units," IEEE Trans. on Very Large Scale Integration (VLSI) Systems, Vol. 16, No. 7, July 2008, pp. 837-850, may be used to implement an appropriate lead zero counter.

Figure 4:
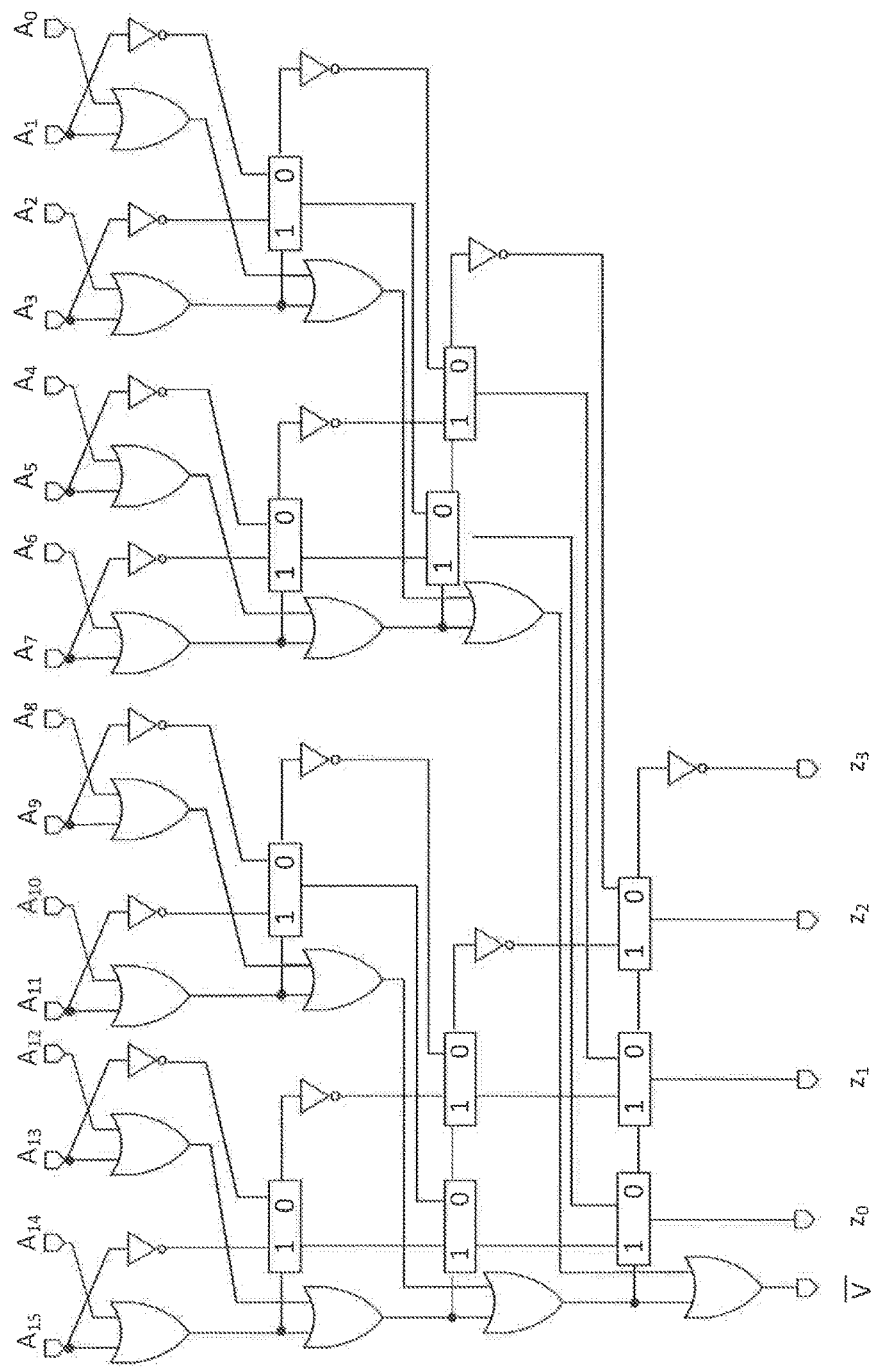
FIG. 4 illustrates a prior art lead zero count operation which may be utilized in some embodiments of the present invention.

FIG. 4 illustrates a 16-bit version of a prior art lead zero counter circuit, as presented in the above-mentioned paper, which may be utilized in some embodiments of the present invention. The circuit receives a 16-bit input A and provides a count of the lead zeros, as indicated by $Z_0$ to $Z_3$.

As such, various embodiments of the present invention may utilize a conventional lead zero counter, with the difference that the input to the lead zero counter has been potentially subjected to one's complementation rather than two's complementation.

In various embodiments, the delay presented by the one's complement lead zero count sub-module may be about 2 $\log_2(I)-1$ levels of 2 input AND gate. As such, the one's complement lead zero count sub-module may potentially form/not form a portion of the conversion circuit critical path.

In various embodiments, the one's complement lead zero count sub-module (LZC) is configured to begin counting the leading zeros of the output of the one's complement sub-module as soon as that output is available. This configuration may reduce overall latency contribution of the one's complement lead zero count sub-module.

Lead Zero Error Detection Sub-Module

As noted above, in various embodiments, since the one's complement lead zero count sub-module performs the leading zero count on the one's complement data, the number of zeros counted may potentially be off by 1 bit due to overestimation. The lead zero error detection sub-module (LZED) is configured to detect whether such overestimation has occurred. If overestimation has occurred, the LZED is configured to set its 1-bit output "error flag" signal to "1". This 1-bit signal is set to '0' otherwise. In some embodiments, the LZED process begins at substantially the same time as the LZC process. The gate delays for these two circuits may be substantially equivalent, in which case there may be no extra delay over and above LZC introduced by LZED. The LZED process may omit explicit use or computation of the output of the two's complement operation, such as an intermediate output or other absolute value output.

The lead zero error detection sub-module provided in accordance with various embodiments of the present invention may operate in the following manner, with reference to FIG. 5A, which illustrates a flow chart corresponding to the lead zero error detection operation.

Figure 5A:
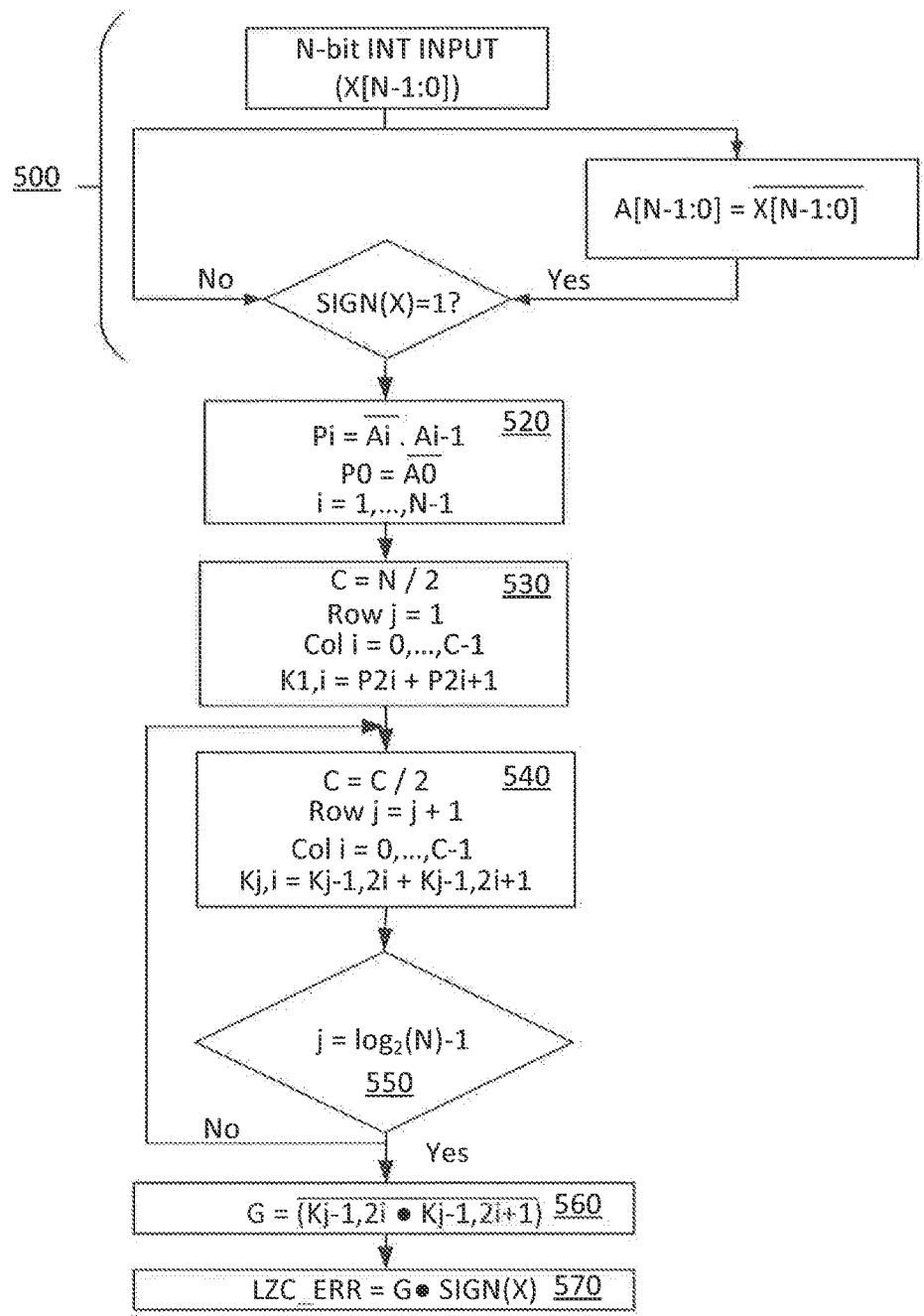
FIG. 5A illustrates a flow chart corresponding to a lead zero detection operation provided in accordance with some other embodiments of the present invention.

A first portion 500 of FIG. 5A corresponds to one's complementing of the integer input as executed by the one's complement process as described above. Namely, an N-bit integer input X is provided and an output A is generated to equal the bit-wise inversion of X if the sign of X is negative, and to equal X if the sign of X is positive. This generates the N-bit integer A input having component bits Ai, i=0 . . . N−1. As such, the first portion 500 of FIG. 5A may be omitted from the lead zero error detection module if the one's complement process has already been performed.

Next, intermediate values Pi are generated 520, with $P(0)=inv(A0)$ and $P(i)=inv(Ai) \cdot A(i-1)$ for $i=1 \ldots N-1$. Here, (x•y) corresponds to a logical AND operation. Next, the first row j=1 of two-dimensional array K is generated 530 by setting $K(1,i)=P(2i)+P(2i+1)$. This is performed for columns i=0 . . . C−1 where C=N/2 initially. Next, the row number j is incremented by one and C is halved 540. Also, the next row of the two-dimensional array K is generated 540 by setting $K(j,i)=K(j-1,2i)+K(j-1,2i+1)$. This is again performed for columns i=0 . . . C−1. Next, it is checked 550 whether the row counter j has reached a value of $\log_2(N)-1$. This check may be inherent to the circuit implementation in accordance with the fixed number of rows of the circuit. If not, operations 540, 550 are repeated. Otherwise, an output value G is generated 560 as $inv(K(j-1,2i) \cdot K(j-1,2i+1))$, and the lead zero error is returned 570 as the value of (G • SIGN(X)).

Figure 5B:
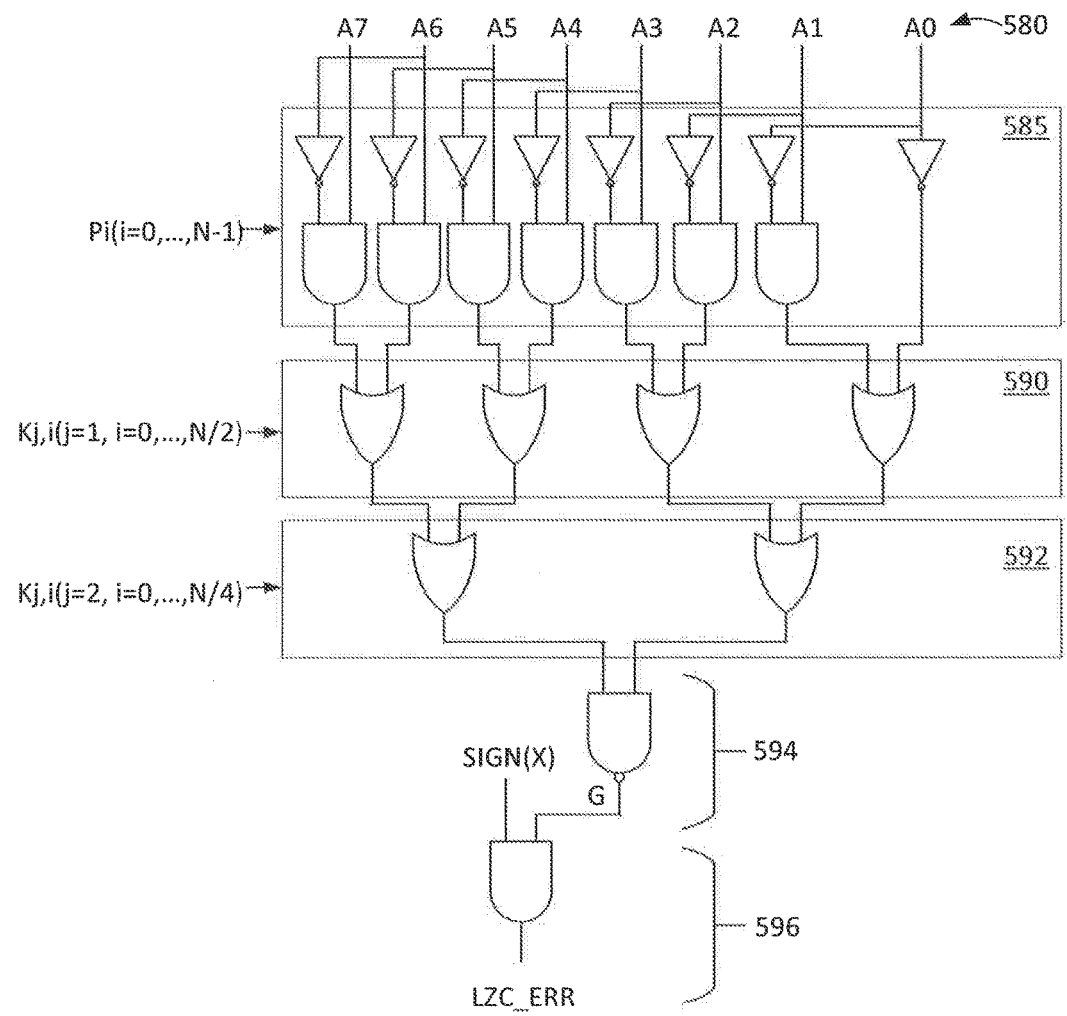
FIG. 5B illustrate circuitry corresponding to a lead zero detection operation provided in accordance with some other embodiments of the present invention.

FIG. 5B illustrates a logic circuit implementation of the lead zero error detection process as illustrated in FIG. 5A, for an 8-bit input. The input A 580 may correspond to the output of the one's complement sub-module as described above. The first level of logic 585 corresponds to the first operation 520 of FIG. 5A. The second level of logic 590 corresponds to operation 530 of FIG. 5A. The third level of logic 592 corresponds to operation 540 of FIG. 5A. The fourth level of logic 594 corresponds to operation 560 of FIG. 5A. The fifth level of logic 596 corresponds to operation 570 of FIG. 5A.

It is noted that, for the process illustrated in FIGS. 5A and 5B, if the signed integer input X (before one's complement) is a negative integer, and the lead zero error detection process indicates an error, then the error flag output will be set to '1.' If X is a negative integer and the lead zero error detection process indicates no error, then the error flag output bit will be set to '0.'

In various embodiments, it is expected that the delay presented by the lead zero detection module is about $\log_2(A)+2$ levels of 2-input AND gate, where A is the number of bits of input data. As such, the lead zero detection module may potentially form/not form a portion of the conversion circuit critical path.

Two's Complement Module

As mentioned above, embodiments of the present invention comprise performing a two's complement operation which corresponds to conditionally two's complementing the signed integer representation if the signed integer representation is negative. As such, an absolute value representation of the signed integer representation may be generated.

In some embodiments, the two's complement module is configured to perform fast two's complement conversion, for example with a gate delay of about $\log_2(I)+4$, where I is the number of bits in the signed integer representation. The sign of the signed integer representation may be used to determine whether or not the input data is to be two's complemented. If the input data is negative, the two's complement module is configured to output a two's complement of the input data. If the input data is positive, the two's complement module is configured to output the input data unchanged. Various circuit designs may be utilized for two's complementing input data in embodiments of the present invention. It may be desirable to utilize circuitry which exhibits desirably low gate delay, low logic depth, low silicon imprint, low power, or the like, or a combination thereof.

In some embodiments, when the input data is positive, the input data is propagated directly to the output of the two's complement module and selected by operation of a multiplexer. For example, the output of an unconditionally operating two's complementing circuit may be provided to a multiplexer, in parallel with a non-two's-complemented copy of the input data, and the sign bit of the input data used as the multiplexer SELECT input. In other embodiments, the input data is propagated through a two's complement circuit, such as an adder-like circuit, regardless of whether the sign of the input data is positive or negative. As noted elsewhere, the sign of the input data may be derived directly from the most significant bit of the signed integer representation in various embodiments.

As mentioned above, the two's complement module is configured to generate an output which corresponds to a representation of the absolute value of the I-bit integer input. That is, if the sign indicates a positive number, then the input is propagated unchanged to provide the output, while if the sign indicates a negative number, then the input is subjected to a two's complement operation and provided to the output. As noted elsewhere, the sign of the input data may be derived directly from the most significant bit of the signed integer representation in various embodiments.

It is noted that various conventional or non-conventional circuits are available for performing two's complement on the input if the sign bit is "1" and for passing the input unchanged if the sign bit is "0." For example, the input may be provided to both a first input of a multiplexer and to an adder or other circuit. The adder or other circuit may be configured to perform the two's complement operation on the input, by effectively performing the subtraction operation $2^n-|k|$, where n is the number of bits in the two's complement representation and k is value of the input. The output of the adder or other circuit is provided to a second input of the multiplexer. Finally, the sign bit is provided as the select line of the multiplexer, in order to select whether the unchanged or two's complemented version of the input should be selected as output.

However, although some embodiments of the present invention may utilize various known, conventional or future-designed circuits for performing two's complement on the input, it may generally be desired to perform this operation in a relatively fast manner, for example with low gate delay, low logic depth, low silicon imprint, low power, or the like, or a combination thereof. As such, embodiments of the present invention provide for a particular implementation of the two's complement module which is considered to be of adequately high performance. One such implementation is described below with respect to FIG. 6.

Figure 6:
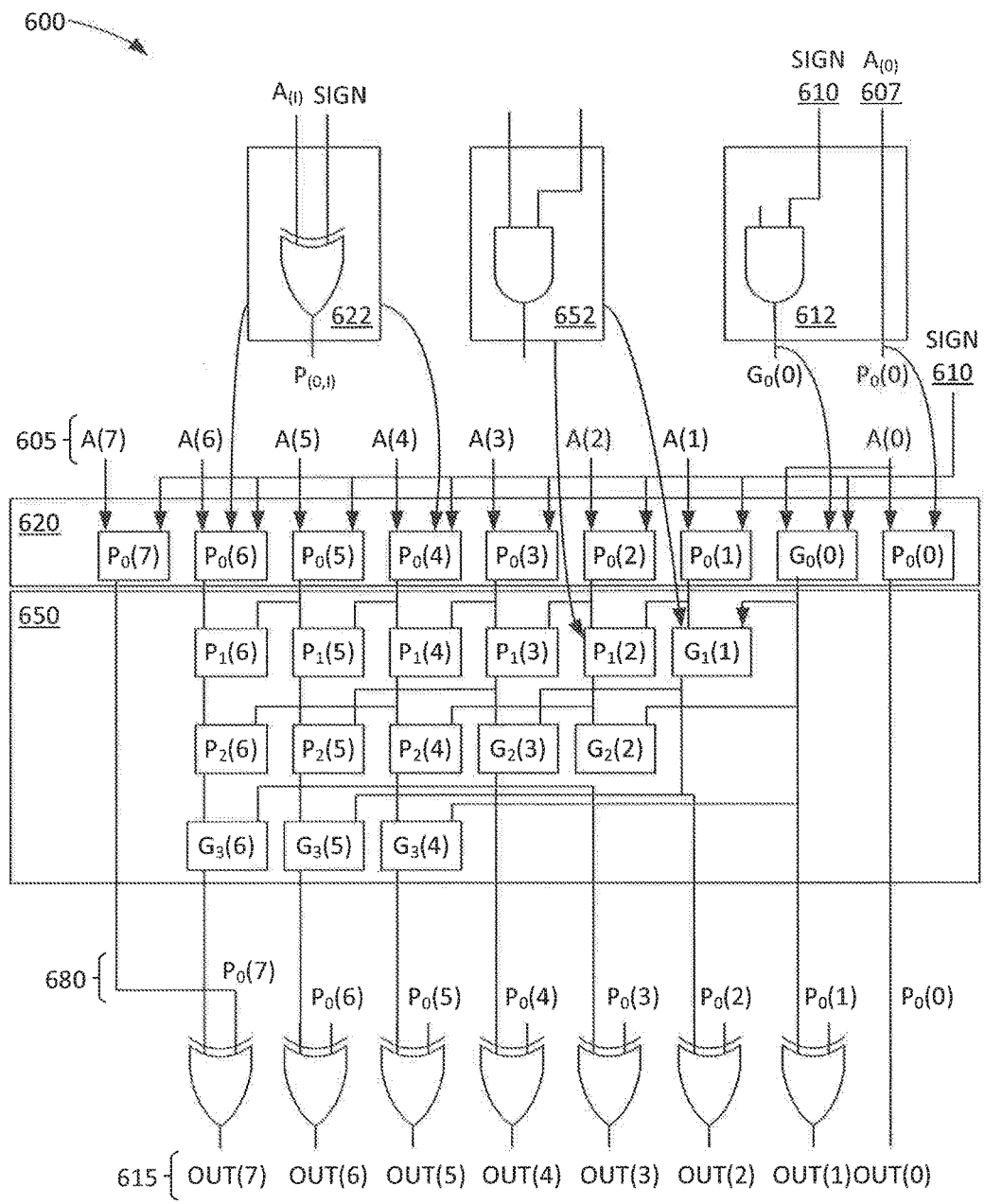
FIG. 6 illustrates a block diagram of a two's complement module provided in accordance with some embodiments of the present invention.

FIG. 6 illustrates a block diagram of a two's complement module 600 operating on 8 bits of input data, provided in accordance with some embodiments of the present invention. While 8 bits has been shown for clarity, the module may be readily adjusted to accommodate more or fewer bits of input data, such as I bits of the signed integer representation.

As illustrated, the two's complement module 600 receives the input "A" 605 and the input sign, which may be the sign bit 610 and generates an output "Out" 615 which is equal to the input A 605 if the sign bit 610 is "0" and which is equal to a two's complement of the input A if the sign bit is "1." In some embodiments, the sign bit 610 may be inherent to the input A 605, for example as the most significant bit. In other embodiments, the sign bit 610 may be provided separately from the input "A" 605.

Figure 8:
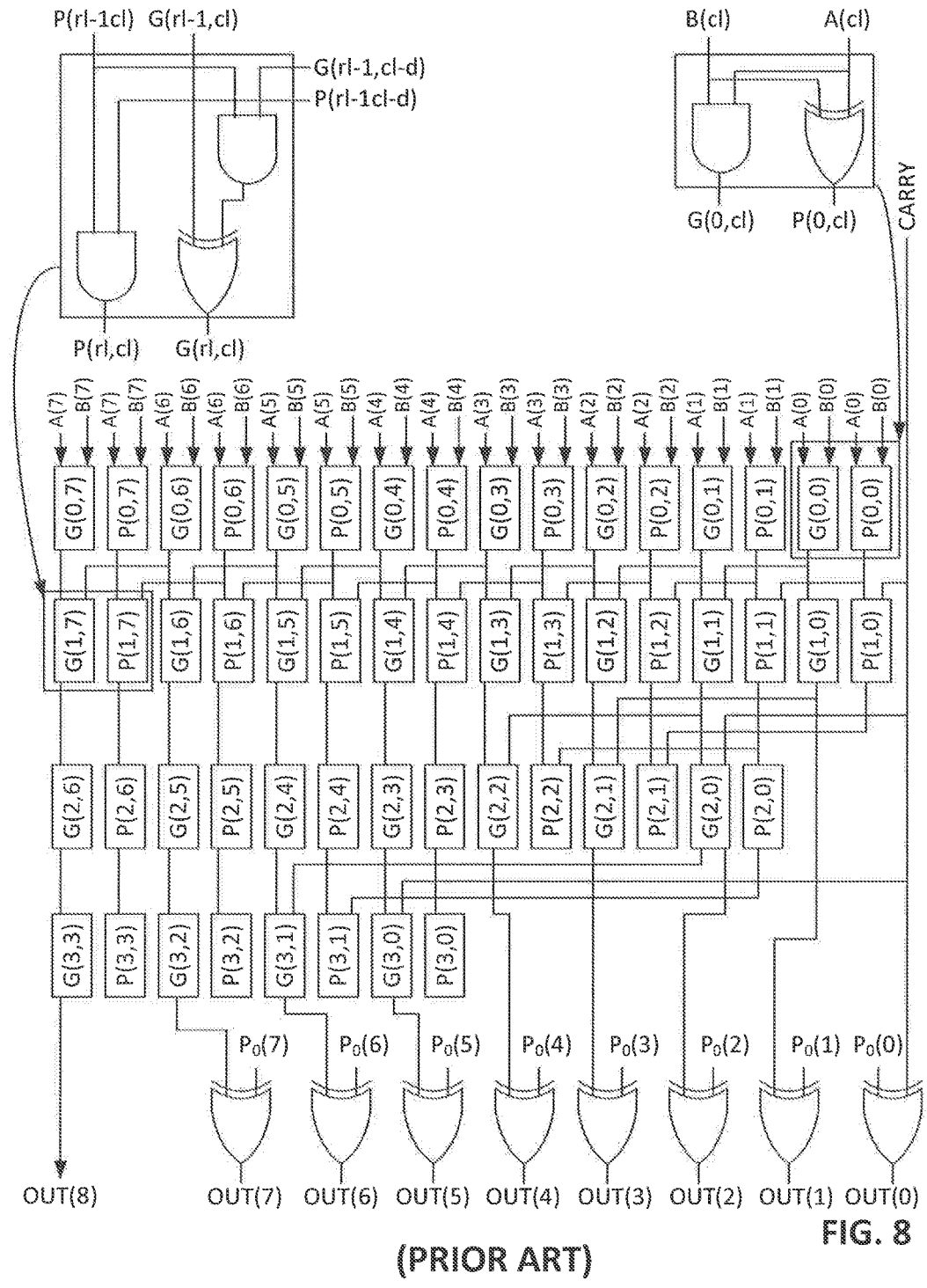
FIG. 8 illustrates a block diagram of a Kogge-Stone adder in accordance with the prior art.

The two's complement module 600 has a structure which is comparable to a Kogge-Stone adder, a version of which is illustrated in FIG. 8 for reference. The number of input bits is denoted K, which may equal I in the context of converting an I-bit signed integer representation to a floating point representation. Rather than a set of initial half-adders as in the Kogge-Stone adder, the two's complement module includes a first level 620 which comprises a number K-1 of XOR gates 622 operating independently and in parallel. Each XOR gate receives as input the sign bit 610 and the $i^{th}$ input bit of A 605, i.e. A(i), for i>0. The output of the $i^{th}$ XOR gate is regarded as a corresponding first stage "propagate" bit $P_0(i)$. Thus, $P_0(i)=A(i)$ XOR sign. For the least significant input bit, i.e. A(0) 607, both a "generate" bit $G_0(0)$ and a "propagate" bit $P_0(0)$ are provided, namely such that $P_0(0)=A(0)$ and $G_0(0)=inv(A(0))\bullet sign$, where "sign" is the value of the binary sign bit input 610, also equal in various embodiments to A(K-1), and "•" represents logical AND. The "generate" bits $G_0(i)$, i>0 have a value of logical '0' are omitted. The least significant bit 607 may therefore be treated by the illustrated circuit 612.

The two's complement module 600 further includes a second level 650 which includes an array of generate and propagate modules. The second level 650 includes a plurality of stages. Starting with r=0, the $r^{th}$-stage generate and propagate bits $\{G_r(i) \text{ and } P_r(i): i=0 \ldots K-1\}$ are provided as inputs to a set of logical operators for generating the $r+1^{st}$ and further stages generate and propagate bits $\{G_{r+k}(i) \text{ and } P_{r+k}(i): i=0 \ldots K-1, k=1, 2 \ldots \}$. Various generate modules $G_r(\ )$ such as $G_{r-1}/(i-2^{r-1})$ are equal to zero and are hence not illustrated. For example, in some embodiments, for rows r from 1 to $\log_2(K)-1$, if $c>2^r$ then $G_r(c)=0$. Further, various propagate modules $P_r(K-1)$ which would otherwise be used in generating an external carry out bit of the adder are not shown as no carry out is required in the embodiment illustrated in FIG. 6.

Further, in various embodiments, the $r^{th}$-stage ($r^{th}=1, 2, \ldots$) generate and propagate bits can be used directly to generate the $r+1^{st}$-stage generate and propagate bits, as follows. For a first portion of the $r^{th}$ stage, generate and propagate bits are passed unchanged from one stage to the next. That is, $P_r(i)=P_{r-1}(i)$, $G_r(i)=G_{r-1}(i)$ for $i=0 \ldots 2^{r-1}-1$. For a second portion of the $r^{th}$ stage, the generate and propagate bits are provided by the evaluations: $P_r(i)=P_{r-1}(i) \bullet P_{r-1}(i-2^{r-1})$, $G_r(i)=P_{r-1}(i) \bullet G_{r-1}(i-2^{r-1})$, for $i=2^{r-1} \ldots K-1$. The count of stages r is maximized at $\log_2(K)$, for a total of r+1 stages. It is noted that this configuration is substantially different from that of a Kogge-Stone adder. Only a single multi-bit input A and a sign bit are provided, which have been manipulated in such a way that the first level 520 includes a $G_0(0)$ element and $P_0(i)$ elements. As a result, the $G_r(i)$ elements for r>0 are also zero except for particular instances such as $G_1, G_2(2), G_3(4)$, etc. as shown in FIG. 6.

It is noted that the second level 650 of the two's complement module comprises an array of generate and propagate modules with an arrangement similar to that of the Kogge-Stone adder, but with significantly fewer generate and/or propagate modules. For example, various generate and/or propagate modules may be omitted as discussed above. Further, the generate and/or propagate modules for stage r=1 and upward correspond to relatively simple AND gates 652 rather than the three-gate combination present in the Kogge-Stone adder.

A third level 680 of the two's complement module comprises a number I-1 (or more generally K-1) of XOR gates in parallel, for combining the appropriate generate and propagate bits in order to effect the final output "sum." The XOR gate for the least significant bit can be omitted, for example due to the lack of an explicit external carry in bit. The output sum may be expressed in various embodiments via:

$$OUT(i)=G_{MAX\_ROW}(i) \text{ XOR } P_0(i) \text{ for } i=1, \ldots K-1,$$

where MAX_ROW=log 2(K); and $$OUT(0)=P_0(0).$$

Figure 7:
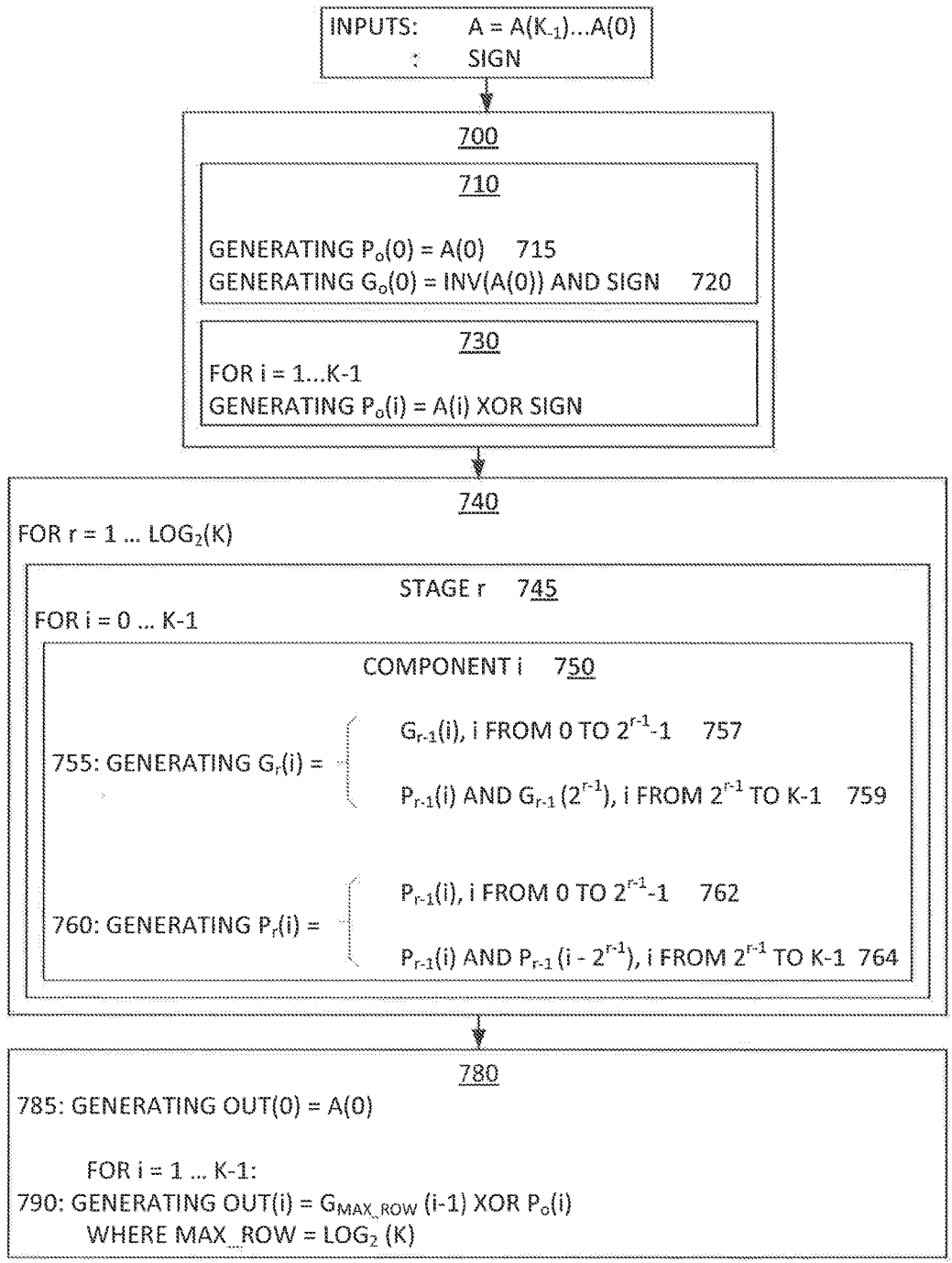
FIG. 7 illustrates a method for generating a representation, in two's complement format, of an input integer A having K bits, in accordance with an embodiment of the present invention.

FIG. 7 illustrates a method for generating a representation, in two's complement format, of an input integer A having K bits, in accordance with an embodiment of the present invention. The method includes three levels. The first level 700 includes a first zero-stage operation 710 performed on a sign bit and a least significant bit A(0) of the input integer. The first zero-stage operation includes generating 715 a zero-stage least-significant-bit propagate output $P_0(0)$ and generating 720 a zero-stage least-significant-bit generate output $G_0(0)$ according to:

$$P_0(0)=A(0); \text{ and}$$

$$G_0(0)=inv(A(0)) \text{ AND sign},$$

where sign corresponds to a logical value of the sign bit. The first level further includes a number of further zero-stage operations 730 performed on the sign bit and a bit A(i) of the input integer. Each further zero-stage operation 730 includes generating a zero-stage propagate output $P_0(i)$ according to:

for i indexed from 1 to K-1, inclusive:

$$P_0(i)=A(i) \text{ XOR sign}; \text{ and}$$

$$G_0(i)=0.$$

The second level 740 includes a number of stages 745 indexed by r, where r assumes whole number values between 1 to MAX_ROW, inclusive, where MAX_ROW equals $\log_2(K)$. Further, each $r^{th}$ stage of the number of stages comprises a number of component operations 750 indexed by i, where i assumes whole number values between 0 and K-1 inclusive. Each of the number of component operations 750 includes generating 755 an $i^{th}$ component of an $r^{th}$ stage generate output $G_r(i)$ and generating 760 an $i^{th}$ component of an $r^{th}$ stage propagate output $P_r(i)$. The outputs are generated according to:

For i ranging from 0 to $2^{r-1}-1$:

$$P_r(i)=P_{r-1}(i) 762;$$

$$G_r(i)=G_{r-1}(i) 757;$$

For i ranging from $2^{r-1}$ to K-1:

$$P_r(i)=P_{r-1}(i) \text{ AND } P_{r-1}(i-2^{r-1}) 764; \text{ and}$$

$$G_r(i)=P_{r-1}(i) \text{ AND } G_{r-1}(i-2^{r-1}) 759.$$

The third level 780 includes generating 785 a least significant bit OUT(0) of the representation according to:

$$OUT(0) = P_0(0) = A(0).$$

The third level further includes generating 790 a number of further bits OUT(i), for i indexed from 1 to K−1, of the representation according to:

$$OUT(i) = G_{MAX\_ROW}(i-1) \text{ XOR } P_0(i).$$

It is further noted that the I-bit two's complement module as illustrated in FIG. 6 above requires an overall delay of $\log_2(I)+4$ levels of 2-input AND gate.

Shift Execution Module

As mentioned above, the shift execution module is configured to shift the output of the two's complement module by a number of bit positions determined in accordance with a number of leading zeros as specified by the lead zero count module. In some embodiments, under a predefined condition, the output of the shift execution module is the mantissa of the floating point representation. A predefined condition can be defined as there being absence of both an underflow condition and an overflow condition. For example, a predefined condition can occur when neither an underflow condition nor an overflow condition is detected.

As also noted above, the shift execution module may include a first shift sub-module and a second shift and/or multiplexer sub-module, for example operating in series. The first shift sub-module is configured to shift the output of the two's complement module by a number of bit positions determined in accordance with, for example corresponding to, the surrogate or estimate value output by the lead zero count module, while the second shift and/or multiplexer sub-module is configured to further shift the output of the first shift sub-module by one bit position if the error flag output by the lead zero count module indicates that the surrogate or estimate value differs from (for example overestimates by one) the number of leading zeros output by the two's complement operation. In various embodiments, the first shift sub-module may execute a left shift while the second shift and/or multiplexer sub-module executes a right-shift and replaces the most significant bit with a logical '1'. As such, the shift execution operation may left shift the intermediate output by a number of bit positions corresponding to either: the estimate of the number of leading zeros if the error flag is clear; or one less than the estimate of the number of leading zeros if the error flag is set.

In various embodiments, the shift execution module and/or its sub-modules may be implemented using barrel shifters, or other appropriate circuitry for implementing a desired bit shift, such as left shifts, right shifts, cyclic or non-cyclic shifts, or the like. Such circuitry may be implemented as would be readily understood by a worker skilled in the art. For example, for an I-bit shifter, where I is the number of input bits, an appropriate barrel shifter corresponding to the first shift sub-module may have $\log_2 I$ levels of 2-input multiplexer. Each multiplexer introduces a delay equivalent to two levels of 2-input AND gate. Hence the total gate delay introduced by the first shift sub-module may be about $2 \log_2 I$ levels of 2-input AND gate. The second shift sub-module may be implemented using a single level of multiplexer and hence may introduce a further gate delay of about 2 levels of 2-input AND gate.

Figure 9:
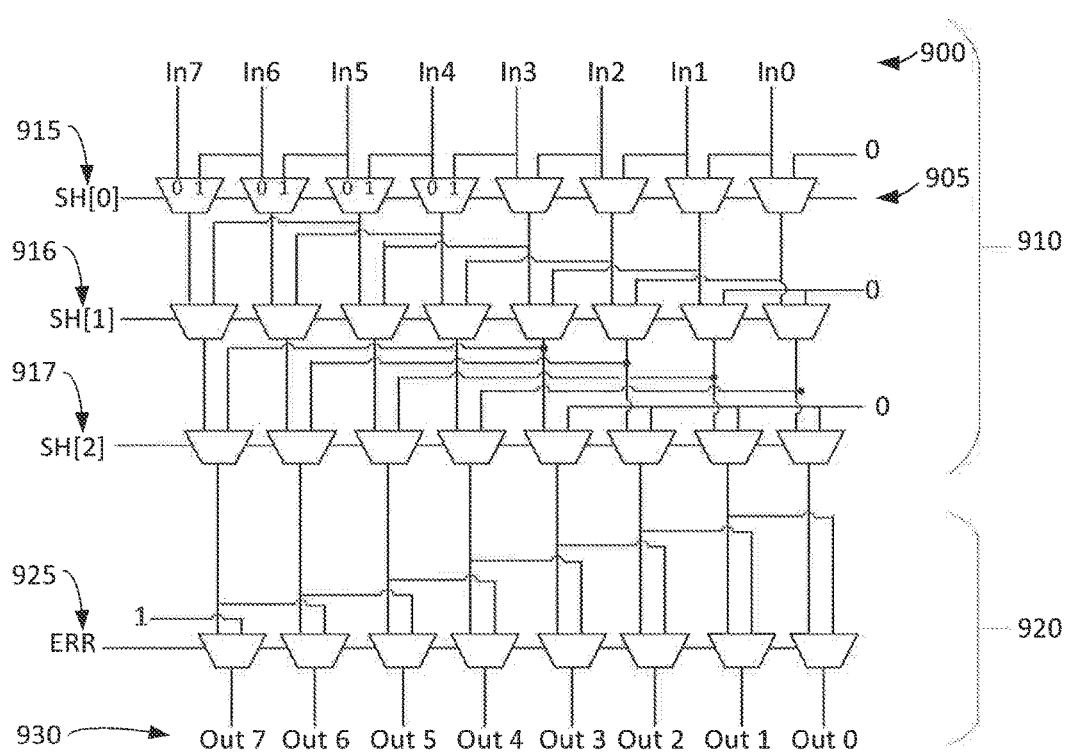
FIG. 9 illustrates a shift execution module provided in accordance with an embodiment of the present invention.

FIG. 9 illustrates a shift execution module comprising a first shift sub-module 910 and second shift sub-module 920, in accordance with an embodiment of the present invention. The present arrangement is configured for operation on an 8-bit signal, however other signal lengths may be accommodated as would be readily understood by a worker skilled in the art. The shift sub-modules comprise multiplexers 905 arranged in successive rows. The first shift sub-module 910 receives an input signal 900 to be left-shifted by between zero and seven bit positions in accordance with a three-bit shift control signal SH[2] 917 SH[1] 916 SH[0] 915. The input signal 900 may correspond to the output of the two's complement module, and the shift control signal may correspond to a portion of the output of the one's complement lead zero count sub-module.

The second shift sub-module 920 receives output of the first shift sub-module to be right-shifted by zero or one bit positions in accordance with a value or ERR 925 which corresponds to the error flag output of the lead zero error detection sub-module. The second shift sub-module provides an output 930 which may correspond to the mantissa prior to potential correction by the overflow/underflow correction module.

In an alternative embodiment, the first shift sub-module and the second shift sub-module may be integrated together. For example, the error flag value output by the lead zero error detection sub-module may be subtracted from the output of the one's complement lead zero count sub-module, and the result then used to control an integrated shift execution module. This would eliminate the need for a second shift sub-module which potentially "undoes" part of the operation of the first shift sub-module. However, such an alternative may require further subtraction circuitry which may potentially cause a net increase in overall conversion delay.

In some embodiments, the output of the lead zero count module may correspond to a number P of positions that a fractional point or radix point is to be shifted. In contrast the shift execution module may be configured to shift the bits of the intermediate output rather than shifting of the fractional point or radix point itself. A solution in various embodiments is to obtain a binary value Q corresponding to the bit-wise inversion of the binary representation of P and shift the bits of the intermediate output by Q positions. In one embodiment, a bank of inverters are coupled to the shift execution module's control signal lines so that the shift execution module is provided with the binary value Q as its control signal. In another embodiment, the inversion may be incorporated into the circuit, for example by swapping the connections of the "1" and "0" inputs for each multiplexer used to implement a shift execution module corresponding for example to the circuit of FIG. 9.

Exponent Generation Module

As mentioned above, the scaling and exponent calculations may be carried out by the exponent generation module, also referred to herein as EXP_SCALE. The exponent generation module generates an exponent value for the floating point representation based at least in part on and/or in accordance with the number of leading zeros determined by the lead zero count module, and in some embodiments based further on a scaling factor input. In some embodiments, the exponent generation module comprises an E-bit 3:2 Carry Save Adder (CSA) or 3:2 compressor, and a further E-bit adder to produce the intermediate value of the E-bit exponent component of the floating point representation. The further adder may be selected as a high-speed adder, such as a Kogge-Stone adder. However, it is recognized that other adders may also be utilized as the further adder, such as but not limited to ripple-carry adders, carry select adders, parallel prefix adders, and carry look-ahead adders such as Brent-Kung adders, hybrid adders, and the like.

Noting that two adders are conventionally used to add three separate E-bit numbers, embodiments of the present invention therefore may be distinguished at least in part from some conventional approaches by the use of a 3:2 compressor or CSA in series with an adder, in place of a more complex conventional circuit which would apply two complete adders in series.

Figure 10A:
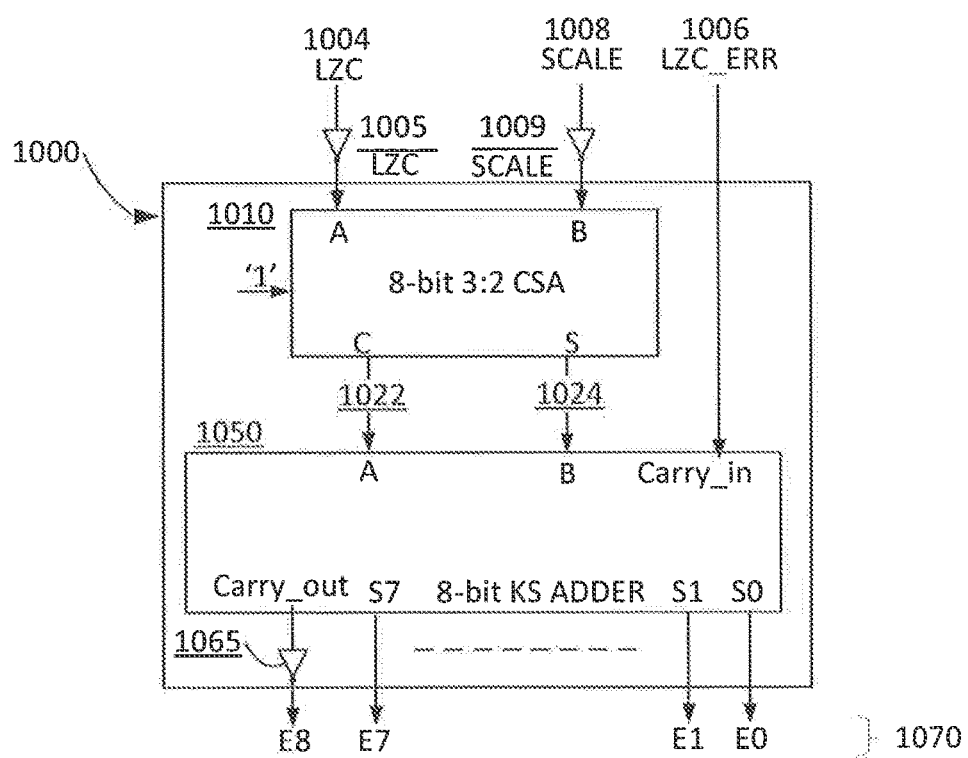
FIG. 10A illustrates an exponent generation module provided in accordance with embodiments of the present invention.
Figure 10B:
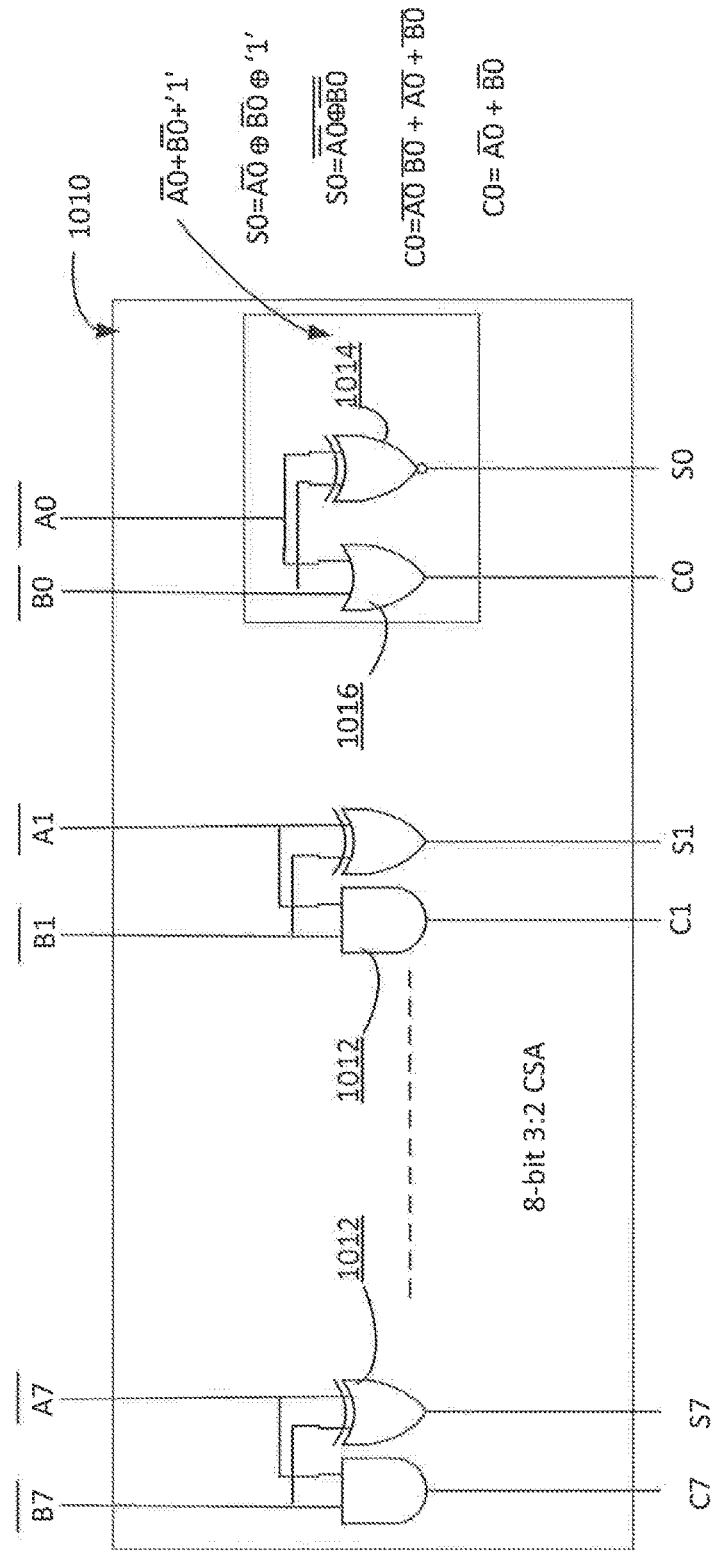
FIG. 10B illustrates a 3:2 compressor or carry-save adder of an exponent generation module provided in accordance with embodiments of the present invention.

FIG. 10A illustrates an exponent generation module 1000 provided in accordance with some embodiments of the present invention. Generally, the exponent generation module comprises a 3:2 compressor 1010, such as a 3:2 carry save adder, and a further adder in the form of a Kogge-Stone adder 1050. Both the compressor 1010 and the Kogge-Stone adder 1050 are illustrated in 8-bit versions for simplicity, however the number of bits may be adjusted to another value of E bits. FIG. 10B further illustrates a gate-level schematic of the 3:2 compressor 1010 in one embodiment of the present invention.

The illustrated exponent generation module 1000 is configured to generate the output exponent value EXP or simply "E" 1070 according to the equation:

$$EXP = MAX\_EXP - LZC - SCALE + LZC\_ERR, \quad (1)$$

where MAX_EXP 1002 (see FIG. 10C) corresponds to a maximum exponent value such as value 125 illustrated in FIGS. 1 and 2, LZC 1004 corresponds to the output of a one's complement lead zero count module or sub-module as described elsewhere herein, such as the surrogate or estimate 157 illustrated in FIGS. 1 and 2, SCALE 1008 corresponds to a provided scaling factor, such as the scaling factor 130 illustrated in FIGS. 1 and 2, and LZC_ERR 1006 corresponds to output of a lead zero error detection module or sub-module as described elsewhere herein, such as the error flag 162 illustrated in FIGS. 1 and 2. As such, the exponent generation module is operatively connected to the lead zero count module to receive at least the determined number of leading zeros therefrom. In general, where the number of bits allocated to the exponent in the floating point representation is E bits, the value of MAX_EXP is equal to $2^E - 1$. It is noted that SCALE may be a signed integer, while LZC may be an unsigned integer, and LZC_ERR may be a one bit flag which is set to '1' if an error in the lead zero count is detected.

For the circuit of FIG. 10A, Equation (1) can be rewritten, with inv(•) denoting the bit-wise complement function, as:

$$EXP = (MAX\_EXP+1) + inv(LZC) + inv(SCALE) + 1 + LZC\_ERR, \quad (2)$$

It is noted that inv(LZC) is denoted in FIG. 10A as 1005, inv(SCALE) is denoted in FIG. 10A as 1009, and LZC_ERR is denoted in FIG. 10A as 1006. It is further noted that Equation (2) is derivable from Equation (1) by recognizing that the value $-x$ is equal to $inv(x)+1$ under two's complement arithmetic.

Further, if MAX_EXP is set to 255, for example as appropriate for use with IEEE 754 single precision floating point integers, Equation (1) can be rewritten, with inv(•) denoting the bit-wise complement function, as:

$$EXP = 256 + (inv(LZC) + inv(SCALE) + 1) + LZC\_ERR. \quad (3)$$

As illustrated, the circuitry of FIGS. 10A and 10B is configured to implement Equation (3). In particular, to assist in performing the sum corresponding to the bracketed quantity in Equation (3), the bit-wise inverted values of LZC and SCALE are provided as inputs to the 3:2 compressor 1010. The 3:2 compressor 1010 comprises a set of half-adders 1012 operating independently and in parallel. Each half-adder receives as input the $j^{th}$ bit of inv(LZC) and the $j^{th}$ bit of inv(SCALE) and provides as output of the 3:2 compressor a corresponding $j^{th}$ sum bit Sj and $j^{th}$ carry bit Cj. This is performed for all except the least significant bits of inv(LZC) and inv(SCALE).

For the least significant bits of inv(LZC) and inv(SCALE), referred to as inv(A0) and inv(B0), the XOR gate of the half-adder is replaced by an XNOR gate 1014 in order to implement the addition of the further constant '+1' occurring in Equation (3) as it affects the sum bit S0. The rationale, illustrated in FIG. 10B, is that S0=inv(A0) XOR inv(B) XOR '1'=inv(inv(A0) XOR inv(B))=inv(A0) XNOR inv(B). In other words, it is noted that the addition of two one-bit numbers with each other and with a further '+1' will generate a sum bit of '1' if and only if there are an odd number of 'ones' in the three summands, which corresponds to the XNOR of the two variable one-bit numbers.

Also for the least significant bits of inv(LZC) and inv(SCALE), referred to as inv(A0) and inv(B0), the AND gate of the half-adder is replaced by an OR gate 1016 in order to implement the addition of the further constant '+1' occurring in Equation (3) as it affects the carry bit C0. The rationale, illustrated in FIG. 10B, is that C0=inv(A0)·inv(B)+inv(A0)+inv(B0), inv(A0)+inv(B0). In other words, it is noted that the addition of two one-bit numbers with each other and with a further '+1' will generate a carry whenever at least one of the two numbers is a '1', which corresponds to the OR (+) function.

As such, the 3:2 compressor is configured to perform the compression of three input operands, namely inv(LZC), inv(SCALE) and constant '1' from Equation (3), into two output operands S and C. The first two digits of the sum (S0) and the carry (C0) may be generated using an optimized 3:2 adder to calculate the sum of the least significant bits of these three inputs. The rest of the sum and carry bits from bit 1 to 7 may be generated using a conventional 2:2 CSA adder.

As such, in various embodiments of the present invention, a 3:2 compressor, such as a carry save adder, is provided which performs the addition of three operands: a constant equal to 1, and two further multi-bit operands, such as E-bit operands. The 3:2 compressor comprises a plurality of half-adders operating independently and in parallel for all bits except the least significant bit of the multi-bit operands. The 3:2 compressor further comprises a modified half-adder configured to receive the least significant bits of the two multi-bit operands and output a carry bit corresponding to the OR of the received least significant bits and a sum bit corresponding to the XNOR of the received least significant bits. Notably, half-adders rather than full adders are utilized in the above, and further the least-significant bit of the 3:2 compressor inherently incorporates a further addition of +1.

Alternatively, other configurations for representing the sum of three inputs inv(LZC), inv(SCALE) and +1 as a pair of outputs, for example via a 3:2 compressor circuit, may be provided.

As also illustrated, the carry 1022 and save 1024 outputs of the 3:2 compressor 1010 are provided to the adder 1050, along with the quantity LZC_ERR 1006, which corresponds to a 1-bit binary value indicative of an overestimate condition on the one's complement lead zero count. The quantity LZC_ERR may be coupled to the external "carry in" input of the adder 1050. The adder 1050 completes the addition of (inv(LZC)+inv(SCALE)+1), which has already been partially processed into carry and save operands by the 3:2 compressor, and also incorporates the addition of LZC_ERR via the external carry in function of the adder.

Figure 10C:
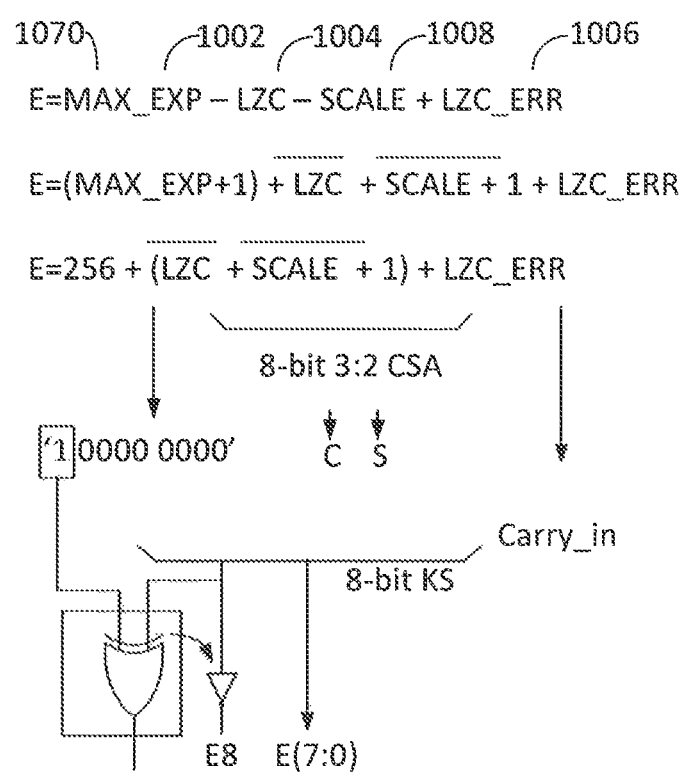
FIG. 10C illustrates operation of an exponent generation module in accordance with embodiments of the present invention.

To complete evaluation of the expression in Equation (3), addition of the value (MAX_EXP+1), for example equal to 256 in the present example implementation, appears to be required. In embodiments of the present invention, the addition of this value is implemented by use of an inverter 1065 applied to the most significant bit output of the adder 1050. The most significant bit output of the adder may be an external carry out output of the adder. Noting that the value of (MAX_EXP+1) is representable by an E-bit+1 value (9-bits in the present example) where all but the most significant bit (MSB) is equal to '0', it has been recognized herein that addition of (MAX_EXP+1) can be implemented by adding '1' to the external carryout bit of the adder 1050. Further, it has been recognized herein that the addition of '1' to the carry_out bit to generate the MSB of the "exponent" output E8 using an XOR gate is equal to the negation of the carry_out bit using an inverter 1065 as shown in FIG. 10C, which illustrates operation of the exponent generation module. The "exponent" output corresponds to the output of the exponent generation module.

Some embodiments of the present invention may utilize the above architecture to add values for generic purposes. For example, a first value A and a second value B may be subtracted from a fixed value D, and a further one-bit value C may be added to the result, wherein A, B and D are N-bit values, D is equal to the largest N-bit value, and A, B and D are expressed in unsigned/signed integer format, respectively. This may be accomplished by replacing MAX_EXP above with D, replacing LZC and SCALE with A and B, and replacing LZC_ERR with C.

Overflow/Underflow Detection Module

As mentioned above, an overflow/underflow detection and/or correction module may be provided in various embodiments of the present invention. Various implementations of such a module may be provided, for example as would be readily understood by a worker skilled in the art or as described elsewhere herein. Alternatively, the overflow/underflow detection and/or correction module may be omitted in some embodiments of the present invention.

In various embodiments, the intermediate values of the exponent and mantissa generated are sent to the overflow/underflow detection module. If no overflow or underflow condition is detected, intermediate values of the exponent and mantissa are sent directly to the output of the integer to floating point conversion apparatus. If underflow or overflow has been detected, the exponent and mantissa at the output of the integer to floating point conversion apparatus are set to zero or saturated to maximum values, respectively.

Comparison with Alternative Implementation

A performance comparison between a particular embodiment of the present invention and a particular alternative implementation of integer to floating point conversion will now be provided. It should be understood that this performance comparison is not necessarily limiting to the present invention, but rather descriptive of certain embodiments. For example, if embodiments of the present invention are modified for example by implementing alternative module circuitry, or by modifying the parallelization of various operations, then the performance values below may be modified.

Alternative Conversion Circuitry

Figure 11:
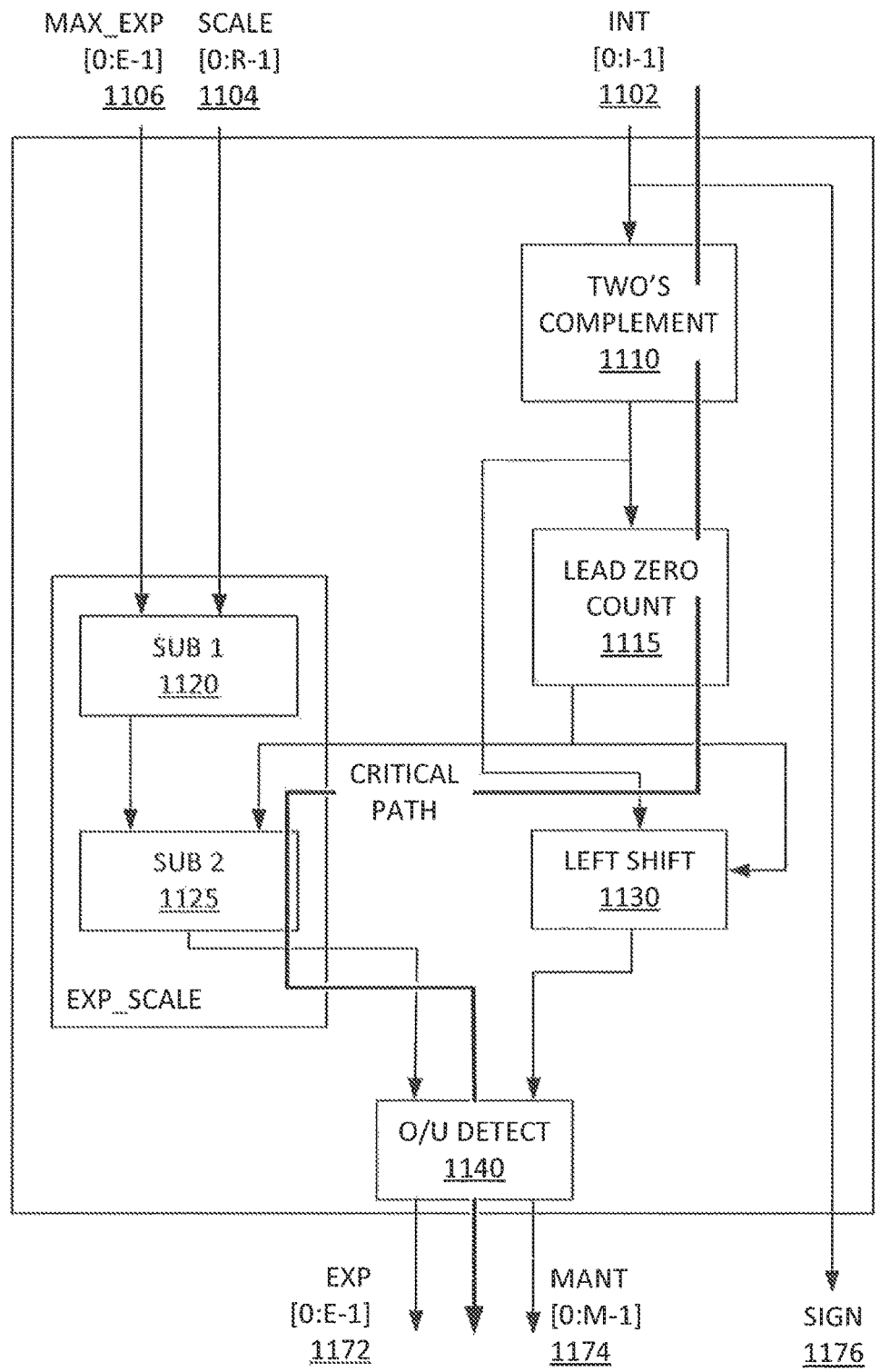
FIG. 11 illustrates a top level block diagram of an apparatus for performing scaling of an input signed integer representation by a scaling factor and conversion to a floating point representation, in accordance with an alternative circuit which is provided as a basis for comparison.

FIG. 11 illustrates a top level block diagram of an apparatus for performing scaling of an input signed integer representation by a scaling factor and conversion to a floating point representation, in accordance with an alternative circuit which is provided solely as a basis for comparison. Although embodiments of the present invention are purported to have advantages over the alternative circuitry, the present discussion should not be taken as an admission that the alternative circuitry is necessarily considered to be prior art.

For the illustrated alternative circuitry, the signed integer scaling and integer to floating point conversion computations consist of two main processes: calculation of the floating point (FP) exponent which includes scaling of the signed integer (INT) input 1102 and calculation for the mantissa of the floating point output. The exponent calculations involve the subtraction 1120 of the value represented the maximum value 1106 of the floating exponent to the scaling factor 1104. The result of the subtraction is then further subtracted 1125 to the number of leading zeros generated by the leading zero counter (LZC) 1115 to produce the intermediate value of the floating point exponent. The mantissa calculation starts with the two's complement (TC) conversion process 1110 which is used to convert the INT input to positive value if the INT input is negative. The LZC 1115 counts the number of leading zeros in the signal that sent out of the TC block 1110. The signals sent out of the LZC are used to control the left-shifting 1130 of the data sent out of the TC block 1110 to produce the intermediate value of the mantissa. The intermediate values of the exponent and mantissa then go through an underflow/overflow (U/O) detection 1140 to generate the exponent 1172 and mantissa 1174 components of the FP output. The sign 1176 of the FP output is generated based on the sign of the INT input.

As shown in FIG. 11, the critical path of this architecture starts from the TC block 1110 then goes through the LZC block 1115 and the SUB2 block 1125 and then through the U/O detection block 1140. The TC block 1110 and the LZC block 1115 are deemed to have a minimum delay of $\log_2(I)+4$ and $2\log_2(I)+2$ levels of 2-input AND gate, respectively. The SUB 2 block 1125 when designed using a Kogge-Stone (KS) adder has a minimum of $2\log_2(E)+4$ gate delays. The O/U block 1140 has 5 levels of gate delays. Thus, the minimum number of gate delays for the FP data to be valid at the output is $3\log_2(I)+2\log_2(E)+11$. For example, to convert a 32-bit signed integer (INT) input data scaled by a 8-bit scaling factor to single precision floating point (FP) represented in IEEE 754 format, a total delay of 32 levels of 2-input AND gate would be required.

Timing Diagram and Critical Path

Figure 12:
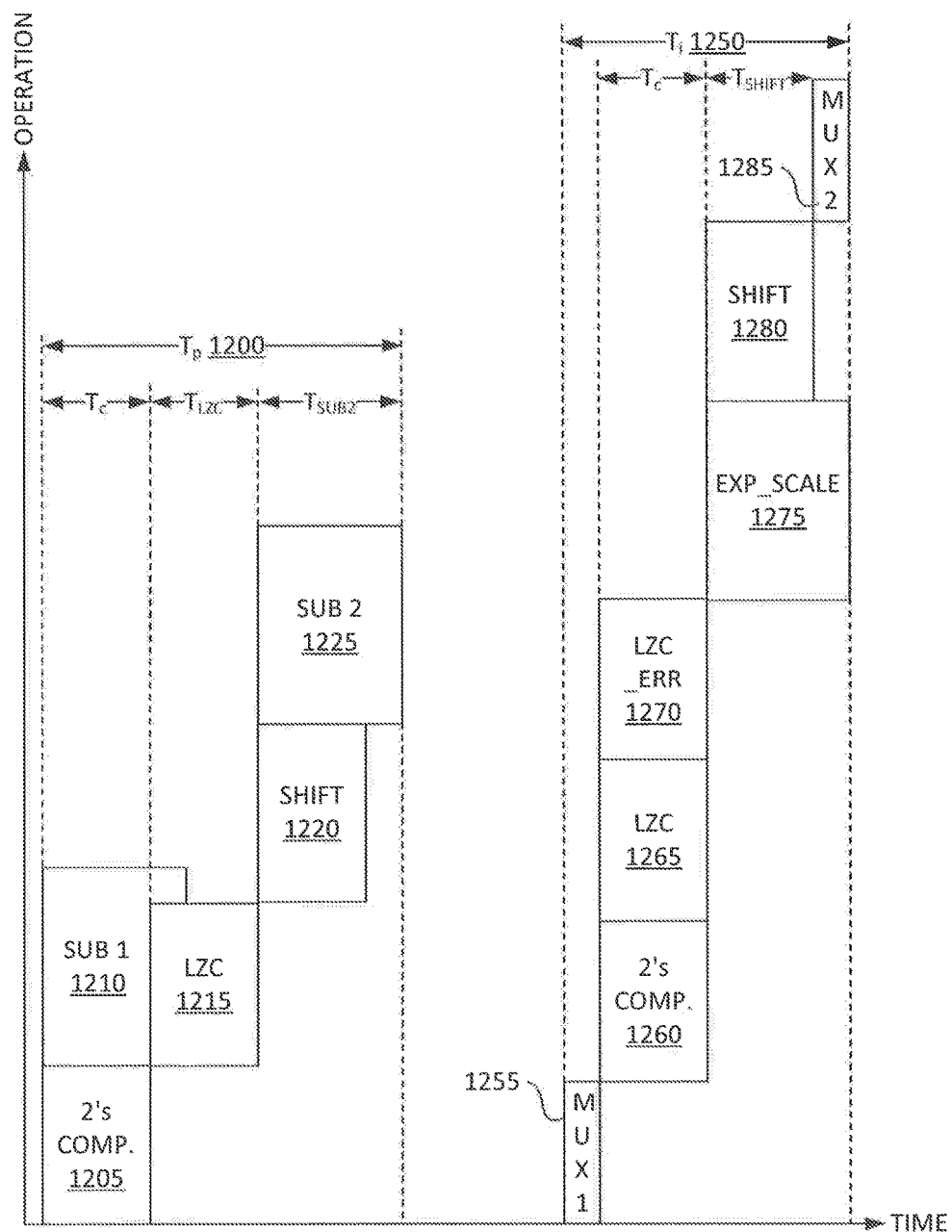
FIG. 12 illustrates timing performance comparisons between a particular embodiment of the present invention and the alternative circuitry as illustrated in FIG. 11.

FIG. 12 depicts timing performance comparisons between a particular embodiment of the present invention and the alternative circuitry as described above. The abbreviations Tp 1200 and Ti 1250 represent the total timing delay of the alternative circuitry and of the particular embodiment of the invention, respectively. As shown on the diagram, the gate delay of the alternative circuitry design Tp is equal to the sum of the delay of the TC 1205, LZC 1215 and SUB 2 1225 processes. The SUB1 1210 process is performed in parallel with the TC 1205 process and the SHIFT 1220 process is performed in parallel with the SUB 2 1225 process. For the Ti, the delay is shorter for example due to the parallel processing of the lead zero count operation (LZC) 1265, the lead zero error detection operation (LZC_ERR) 1270 and the two's complement (TC) operation 1260. The exponent generation operation (EXP_SCALE) 1275 and shift execution operation (SHIFT) 1280, 1285 also operate in parallel.

The particular embodiment of the present invention used in the present comparison corresponds to one in which the one's complement lead zero count module, the lead zero error detection module, and the two's complement module all operate in parallel. Since the overall gate delay of the two's complement module is slightly larger, it is on the critical path. In some embodiments, the critical path starts from the multiplexer of the one's complement sub-module, proceeds to the two's complement module, to the shift execution module, and ends at the overflow/underflow detection module. Such a critical path 1290 is illustrated as an example in FIG. 2. The two's complement module, the shift execution module and the overflow/underflow detection module have gate delays of about $\log_2(I)+4$, $2\log_2(I)$, and 5 levels of 2-input AND gate, respectively. Based on this architecture, the total number of gate delays required for the data to be available at the output of the present embodiment is about $3\log_2(I)+13$. For example, to convert an input 32-bit signed integer representation scaled by a 8-bit scaling factor to a single precision floating point representation in IEEE 754 format, a total delay of about 28 levels of 2-input AND gate would be required in the present embodiment. Compared to 32 levels of gate delays required to compute for the same set of data based on an architecture designed based on the reference circuitry, this embodiment of the present invention may be deemed to exhibit improved throughput performance.

As will be apparent from the above detailed description, a design that performs the scaling of an integer input data by a scaling factor and then converts the scaled result to floating point format is provided in accordance with various embodiments of the present invention. The overall circuit may exhibit high throughput performance with low usage of logic resources. The scaling and exponent calculations may be carried out by an exponent generation operation/module which may also exhibit fast throughput performance and efficient use of logic resource. For E-bit exponent, the exponent generation design according to some embodiments requires a total of an E-bit 3:2 Carry Save Adder (CSA) and an E-bit Kogge-Stone (KS) adder compared to two E-bit KS adders which may otherwise be required for this purpose. Furthermore, to achieve fast throughput performance, the overall circuit may comprise a two's complement module and a lead zero count module performing in parallel. As such, the propagation delay causing by the lead zero count module may be fully or at least partially masked and the overall critical path may be shortened. Thus, the critical path of some embodiments of the overall circuit may be viewed as being determined by the two's complement module, the execution module, and the overflow/underflow detection/correction module. As a result, to scale and convert an I-bit integer to floating point data with an I-bit mantissa, an overall delay of $3\log 2(I)+13$ levels of 2-input AND gate may be required in such embodiments.

In more detail, the overall propagation delay required by some embodiments of the present invention to compute for the integer scaling and integer to floating point conversion is equal to about $3\log_2(I)+13$ levels of 2-input AND gate where I is the number of bits of the signed integer input. Thus, based on the circuit architecture proposed in this invention, to convert a 32-bit signed integer input data scaled by a 8-bit scaling factor to single precision floating point represented in IEEE 754 format, a total delay of 28 levels of 2-input AND gate may be required in such embodiments.

Through the descriptions of the preceding embodiments, the present invention may be implemented by using hardware only or by using software and a necessary universal hardware platform. Based on such understandings, the technical solution of the present invention may be embodied in the form of a software product. The software product may be stored in a non-volatile or non-transitory storage medium, which can be a compact disk read-only memory (CD-ROM), USB flash disk, or a removable hard disk. The software product includes a number of instructions that enable a computer device (personal computer, server, or network device) to execute the methods provided in the embodiments of the present invention. For example, such an execution may correspond to a simulation of the logical operations as described herein. The software product may additionally or alternatively include number of instructions that enable a computer device to execute operations for configuring or programming a digital logic apparatus in accordance with embodiments of the present invention.

Although the present invention has been described with reference to specific features and embodiments thereof, it is evident that various modifications and combinations can be made thereto without departing from the invention. The specification and drawings are, accordingly, to be regarded simply as an illustration of the invention as defined by the appended claims, and are contemplated to cover any and all modifications, variations, combinations or equivalents that fall within the scope of the present invention.

We claim:

1. An apparatus for conversion of a signed integer representation to a floating point representation, the signed integer representation having a two's complement format, the apparatus comprising:
   a two's complement circuitry configured to generate an intermediate output corresponding to an absolute value of the signed integer representation, the absolute value expressed in two's complement format; and
   a lead zero count circuitry configured to operate in parallel with the two's complement circuitry, the lead zero count circuitry configured to make a determination of a number of leading zeros that are expected to occur in the intermediate output, said determination made independently from generation of the intermediate output;
   an exponent generation circuitry, operatively connected to the lead zero count circuitry to receive the determined number of leading zeros and configured to generate an exponent value for the floating point representation in accordance with the received number of leading zeros determined; and
   a shift execution circuitry configured to left shift the intermediate output by a number of bit positions determined in accordance with the determined number of leading zeros, wherein the shift execution circuitry outputs a mantissa of the floating point representation under a predefined condition.

2. The apparatus of claim 1, wherein the predefined condition occurs when neither an underflow condition nor an overflow condition is detected.

3. The apparatus of claim 1, wherein the exponent generation circuitry is configured to generate the exponent value for the floating point representation further based on a scaling factor input.

4. The apparatus of claim 3, wherein the number of leading zeros is expressed as a first value and a second value, the first value corresponding to an estimate of the number of leading zeros which either matches the number of leading zeros or overestimates the number of leading zeros by one, the second value corresponding to a binary flag which is set if the estimate of the number of leading zeros overestimates the number of leading zeros by one and is clear otherwise, and wherein the exponent generation circuitry comprises:
   a 3:2 compressor configured to receive a first input corresponding to a bit-wise inversion of the estimate of the number of leading zeros and a second input corresponding to a bit-wise inversion of the scaling factor input and to generate a sum output and a carry output corresponding to carry-save addition of the first input with the second input and with a constant value of one;

an adder configured to receive and add the sum output, the carry output, and the binary flag, the binary flag provided to an external carry-in input of the adder; and an inverter configured to invert a most significant bit of the adder output.

5. The apparatus of claim 4, wherein the adder is a Kogge-Stone adder.

6. The apparatus of claim 4, wherein the 3:2 compressor comprises a modified half-adder configured to receive a least significant bit of the first input and a least significant bit of the second input, the modified half-adder configured to:

generate a least significant bit of the sum output corresponding to an XNOR operation performed on the least significant bit of the first input and the least significant bit of the second input; and generate a least significant bit of the carry output corresponding to an OR operation performed on the least significant bit of the first input and the least significant bit of the second input.

7. The apparatus of claim 1, wherein the number of leading zeros is expressed as a first value and a second value, the first value corresponding to an estimate of the number of leading zeros which either matches the number of leading zeros or overestimates the number of leading zeros by one, the second value corresponding to a binary flag which is set if the estimate of the number of leading zeros overestimates the number of leading zeros by one and is clear otherwise, the apparatus further comprising a shift execution circuitry configured to left shift the intermediate output by a number of bit positions corresponding to either: the first value if the binary flag is clear; or one less than the first value if the binary flag is set.

8. The apparatus of claim 1, wherein the exponent generation circuitry and the shift execution circuitry operate in parallel and the exponent generation circuitry is configured to generate the exponent value for the floating point representation further based on a scaling factor input.

9. The apparatus of claim 8, further comprising an overflow/underflow detection circuitry configured to generate an exponent and a mantissa of the floating point representation based on output of the exponent generation circuitry and the shift execution circuitry, the overflow/underflow detection circuitry configured to set the exponent and the mantissa to a predetermined saturated value upon detection of an overflow condition or an underflow condition.

10. The apparatus of claim 1, wherein a number of bits in the signed integer representation is denoted I, wherein the two's complement circuitry comprises:

a first level comprising:

a first zero-stage circuit configured to receive a sign bit and a least significant bit A(0) of the signed integer representation, the first zero-stage circuit configured to generate a zero-stage least-significant-bit propagate output $P_0(0)$ and a zero-stage least-significant-bit generate output $G_0(0)$ according to:

$$P_0(0)=A(0);$$

$$G_0(0)=\text{inv}(A(0))\text{ AND sign},$$

wherein inv( ) corresponds to a logical inversion operation, AND corresponds to a logical AND operation, and sign corresponds to a logical value of the sign; and for whole number values of i indexed from 1 to I, inclusive a further zero-stage circuit configured to receive the sign bit and a bit A(i) of the signed integer representation other than A(0), the further zero-stage circuit configured to generate a zero-stage propagate output $P_0(i)$ according to:

$$P_0(i)=A(i)\text{ XOR sign},$$

wherein XOR corresponds to a logical XOR operation;

a second level comprising a number of stages indexed by r, wherein r assumes whole number values between 1 and $\log_2(I)$ inclusive, wherein each $r^{th}$ stage of the number of stages comprises a number of components indexed by i, wherein i assumes whole number values between 0 and I−1 inclusive, and wherein each of the number of components is configured to generate an $i^{th}$ component of an $r^{th}$ stage generate output $G_r(i)$ and an $i^{th}$ component of an $r^{th}$ stage propagate output $P_r(i)$ according to:

for i ranging from 0 to $2^{r-1}-1$, inclusive:

$$P_r(i)=P_{r-1}(i),$$

$$G_r(i)=G_{r-1}(i); \text{ and}$$

for i ranging from $2^{r-1}$ to I−1, inclusive:

$$P_r(i)=P_{r-1}(i)\text{ AND }P_{r-1}(i-2^{r-1}),$$

$$G_r(i)=P_{r-1}(i)\text{ AND }G_{r-1}(i-2^{r-1}); \text{ and}$$

a third level configured to generate a least significant bit OUT(0) of the pre-shift output, the least significant bit OUT(0) equal to the least significant bit A(0) of the signed integer representation, the third level further configured to generate a number of further bits OUT(i) of the pre-shift output according to:

$$\text{OUT}(i)=G_{MAX\_ROW}(i-1)\text{ XOR }P_0(i),$$

wherein MAX_ROW equals $\log_2(I)$.

11. The apparatus of claim 1, wherein the lead zero count circuitry comprises:

a one's complement sub-circuitry configured to generate a first output corresponding to a one's complement of the signed integer representation if the signed integer representation is negative and corresponding to the signed integer representation if the signed integer representation is positive;

a one's complement lead zero count sub-circuitry configured to determine a number of leading zeros present in the first output; and a lead zero error detection sub-circuitry configured to operate in parallel with the one's complement lead zero count sub-circuitry and configured to:

determine if the number of leading zeros present in the first output differs from a number of leading zeros of the intermediate output, wherein the lead zero error detection sub-circuitry omits explicit use or computation of the intermediate output; and set a zero count error flag if the number of leading zeros present in the first output differs from the number of leading zeros of the intermediate output.

12. A method for facilitating conversion of a signed integer representation to a floating point representation, the signed integer representation having a two's complement format, the method comprising:

a two's complement operation, performed by a two's complement circuitry, the two's complement operation comprising generating an intermediate output corresponding to an absolute value of the signed integer representation, the absolute value expressed in two's complement format; and
a lead zero count operation, performed by a lead zero count circuitry operating concurrently with the two's complement circuitry, the lead zero count operation comprising making a determination of a number of leading zeros that are expected to occur in the intermediate output, said determination made independently from said generation of the intermediate output;
an exponent generation operation, performed by an exponent generation circuitry operatively connect to the lead zero count circuitry, the exponent generation operation comprising generating an exponent value for the floating point representation in accordance with the number of leading zeros determined; and
a shift execution operation, performed by a shift execution circuitry, the shift execution operation comprising left shifting the intermediate output by a number of bit positions determined in accordance with the determined number of leading zeros, wherein the shift execution operation outputs a mantissa of the floating point representation under a predefined condition.

13. The method of claim 12, wherein the predefined condition occurs when neither an underflow condition nor an overflow condition is detected.

14. The method of claim 12, wherein the exponent generation operation generates the exponent value for the floating point representation in accordance with: the number of leading zeros determined by the lead zero count operation; and a scaling factor input.

15. The method of claim 14, wherein the number of leading zeros is expressed as a first value and a second value, the first value corresponding to an estimate of the number of leading zeros which either matches the number of leading zeros or overestimates the number of leading zeros by one, the second value corresponding to a binary flag which is set if the estimate of the number of leading zeros overestimates the number of leading zeros by one and is clear otherwise, and wherein the exponent generation operation comprises:
receiving a first input corresponding to a bit-wise inversion of the estimate of the number of leading zeros and receiving a second input corresponding to a bit-wise inversion of the scaling factor input and generating a sum output and a carry output corresponding to carry-save addition of the first input with the second input and with a constant value of one;
receiving and adding the sum output, the carry output, and the binary flag, the binary flag treated as an external carry-in input for addition thereof; and
inverting a most significant bit of the adder output.

16. The method of claim 15, wherein generating the sum output and the carry output comprises:
generating a least significant bit of the sum output corresponding to an XNOR operation performed on a least significant bit of the first input and a least significant bit of the second input; and
generating a least significant bit of the carry output corresponding to an OR operation performed on the least significant bit of the first input and the least significant bit of the second input.

17. The method of claim 12, wherein the number of leading zeros is expressed as a first value and a second value, the first value corresponding to an estimate of the number of leading zeros which either matches the number of leading zeros or overestimates the number of leading zeros by one, the second value corresponding to a binary flag which is set if the estimate of the number of leading zeros overestimates the number of leading zeros by one and is clear otherwise, the method further comprising a shift execution operation comprising left shifting of the intermediate output by a number of bit positions corresponding to either: the first value if the binary flag is clear; or one less than the first value if the binary flag is set.

18. The method of claim 12, further comprising an exponent generation operation and a shift execution operation operating concurrently, the exponent generation operation comprising generating an exponent value for the floating point representation in accordance with: the number of leading zeros determined by the lead zero count operation; and a scaling factor input, the shift execution operation comprising left shifting of the intermediate output by a number of bit positions determined in accordance with the determined number of leading zeros.

19. The method of claim 18, further comprising an overflow/underflow detection operation comprising generating an exponent and a mantissa of the floating point representation based on output of the exponent generation operation and the shift execution operation, the overflow/underflow detection operation comprising setting the exponent and the mantissa to a predetermined saturated value upon detection of an overflow condition or an underflow condition.

20. The method of claim 12, wherein a number of bits in the signed integer representation is denoted I, wherein the two's complement operation comprises:
a first level comprising:
a first zero-stage operation performed on a sign bit and a least significant bit A(0) of the signed integer representation, the first zero-stage operation including generating a zero-stage least-significant-bit propagate output $P_0(0)$ and a zero-stage least-significant-bit generate output $G_0(0)$ according to:

$P_0(0)=A(0);$ $G_0(0)=\text{inv}(A(0))\text{AND sign},$ wherein inv( ) corresponds to a logical inversion operation, AND corresponds to a logical AND operation, and sign corresponds to a logical value of the sign; and
for whole number values of i indexed from 1 to I, inclusive a further zero-stage operation performed on the sign bit and a bit A(i) of the signed integer representation other than A(0), the further zero-stage operation including generating a zero-stage propagate output $P_0(i)$ according to:

$P_0(i)=A(i)\text{XOR sign},$ wherein XOR corresponds to a logical XOR operation;
a second level comprising a number of stages indexed by r, wherein r assumes whole number values between 1 and $\log_2(I)$ inclusive, wherein each $r^{th}$ stage of the number of stages comprises a number of component operations indexed by i, wherein i assumes whole number values between 0 and I−1 inclusive, and wherein each of the number of component operations includes generating an $i^{th}$ component of an $r^{th}$ stage generate output $G_r(i)$ and an $i^{th}$ component of an $r^{th}$ stage propagate output $P_r(i)$ according to:
for i ranging from 0 to $2^{r-1}-1$, inclusive:

$P_rN=P_{r-1}(i),$ $G_r(i)=G_{r-1}(i);$ and for i ranging from $2^{r-1}$ to I−1, inclusive:

$P_r(i)=P_{r-1}(i) \text{AND } P_{r-1}(i-2^{r-1})$, $G_r(i)=P_{r-1}(i) \text{AND } G_{r-1}(i-2^{r-1})$; and a third level including generating a least significant bit OUT(0) of the pre-shift output, the least significant bit OUT(0) equal to the least significant bit A(0) of the signed integer representation, the third level further including generating a number of further bits OUT(i) of the pre-shift output according to:

$OUT(i)=G_{MAX\_ROW}(i-1) \text{XOR } P_0(i)$, wherein MAX_ROW equals $\log_2(I)$.

21. The method of claim 12, wherein the lead zero count operation comprises:
   a one's complement sub-operation comprising generating a first output corresponding to a one's complement of the signed integer representation if the signed integer representation is negative and corresponding to the signed integer representation if the signed integer representation is positive;
   a one's complement lead zero count sub-operation comprising determining a number of leading zeros present in the first output; and
   a lead zero error detection sub-operation operating in parallel with the one's complement lead zero count sub-operation and comprising:
      determining if the number of leading zeros present in the first output differs from a number of leading zeros of the intermediate output, wherein the lead zero error detection sub-operation omits explicit use or computation of the intermediate output; and
      setting a zero count error flag if the number of leading zeros present in the first output differs from the number of leading zeros of the intermediate output.

* * * * *

UNITED STATES PATENT AND TRADEMARK OFFICE
CERTIFICATE OF CORRECTION

PATENT NO. : 10,089,073 B2
APPLICATION NO. : 14/610029
DATED : October 2, 2018
INVENTOR(S) : Huong Ho and Michel Kafrouni It is certified that error appears in the above-identified patent and that said Letters Patent is hereby corrected as shown below:

In the Description:

Column 16, Line 60, "$P_r(i) – P_{r-1}(i) 762;$" should read -- $P_r(i) = P_{r-1}(i)\ \mathbf{762};$ --

Signed and Sealed this
Twenty-third Day of April, 2019

Andrei Iancu
*Director of the United States Patent and Trademark Office*